United States Patent
Kato et al.

(10) Patent No.: US 10,248,031 B2
(45) Date of Patent: Apr. 2, 2019

(54) MULTIPLE CHARGED PARTICLE BEAM LITHOGRAPHY APPARATUS AND MULTIPLE CHARGED PARTICLE BEAM PATTERN WRITING METHOD

(71) Applicant: NuFlare Technology, Inc., Yokohama-shi (JP)

(72) Inventors: Yasuo Kato, Yokohama (JP); Ryoh Kawana, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/944,834

(22) Filed: Apr. 4, 2018

(65) Prior Publication Data

US 2018/0307144 A1 Oct. 25, 2018

(30) Foreign Application Priority Data

Apr. 19, 2017 (JP) ................................. 2017-082861

(51) Int. Cl.
*G03B 27/42* (2006.01)
*G03F 7/20* (2006.01)

(52) U.S. Cl.
CPC ........ *G03F 7/70558* (2013.01); *G03F 7/7005* (2013.01); *G03F 7/705* (2013.01); *G03F 7/70508* (2013.01)

(58) Field of Classification Search
CPC combination set(s) only.
See application file for complete search history.

(56) References Cited

U.S. PATENT DOCUMENTS

| 2013/0320230 A1 | 12/2013 | Yoshikawa et al. |
| 2016/0155610 A1 | 6/2016 | Kawana et al. |
| 2016/0181062 A1 | 6/2016 | Kato et al. |
| 2017/0229280 A1 | 8/2017 | Kato et al. |

FOREIGN PATENT DOCUMENTS

| JP | 2014-7379 A1 | 1/2014 |
| JP | 2016-103557 A1 | 6/2016 |
| JP | 2016-119423 A1 | 6/2016 |
| JP | 2017-143235 A1 | 8/2017 |

*Primary Examiner* — Mesfin T Asfaw
(74) *Attorney, Agent, or Firm* — Oblon, McClelland, Maier & Neustadt, L.L.P.

(57) ABSTRACT

According to one aspect of the present invention, a multiple charged particle beam lithography apparatus includes dose operation processing circuitry configured to, in a case that a pattern is written into a pattern writing region sufficiently larger than the setting region in a target object by using the multiple charged particle beams following the pattern writing sequence, operate an incident dose of a beam to each position intended inside the pattern writing region by continuously using repeatedly data of dose modulation value groups defined for a plurality of pixel regions of a same block among a plurality of blocks obtained by dividing a dose modulation map for each preset number of pixel regions without switching to data of dose modulation value groups of other blocks.

10 Claims, 20 Drawing Sheets

FIG.11 With Correction (First Shot)

| 0.0 | 0.0 | 0.0 | 0.0 | 0.0 | 0.0 | 0.0 | 0.0 |
|-----|------|------|-----|-----|------|------|-----|
| 0.0 | 0.0 | 0.0 | 0.0 | 0.0 | 0.0 | 0.0 | 0.0 |
| 0.0 | 0.20 | 0.05 | 0.0 | 0.0 | 0.20 | 0.05 | 0.0 |
| 0.0 | 0.60 | 0.15 | 0.0 | 0.0 | 0.65 | 0.10 | 0.0 |
| 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 |
| 0.0 | 0.14 | 0.07 | 0.0 | 0.0 | 0.10 | 0.10 | 0.0 |
| 0.0 | 0.64 | 0.15 | 0.0 | 0.0 | 0.70 | 0.10 | 0.0 |
| 0.0 | 0.0 | 0.0 | 0.0 | 0.0 | 0.0 | 0.0 | 0.0 |

FIG.12 With Correction (Second Shot)

| 0.0 | 0.0 | 0.0 | 0.0 | 0.0 | 0.0 | 0.0 | 0.0 |
|-----|------|------|-----|-----|------|------|-----|
| 0.0 | 0.20 | 0.05 | 0.0 | 0.0 | 0.20 | 0.05 | 0.0 |
| 0.0 | 0.60 | 0.15 | 0.0 | 0.0 | 0.65 | 0.10 | 0.0 |
| 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 |
| 0.0 | 0.14 | 0.07 | 0.0 | 0.0 | 0.10 | 0.10 | 0.0 |
| 0.0 | 0.64 | 0.15 | 0.0 | 0.0 | 0.70 | 0.10 | 0.0 |
| 0.0 | 0.0 | 0.0 | 0.0 | 0.0 | 0.0 | 0.0 | 0.0 |

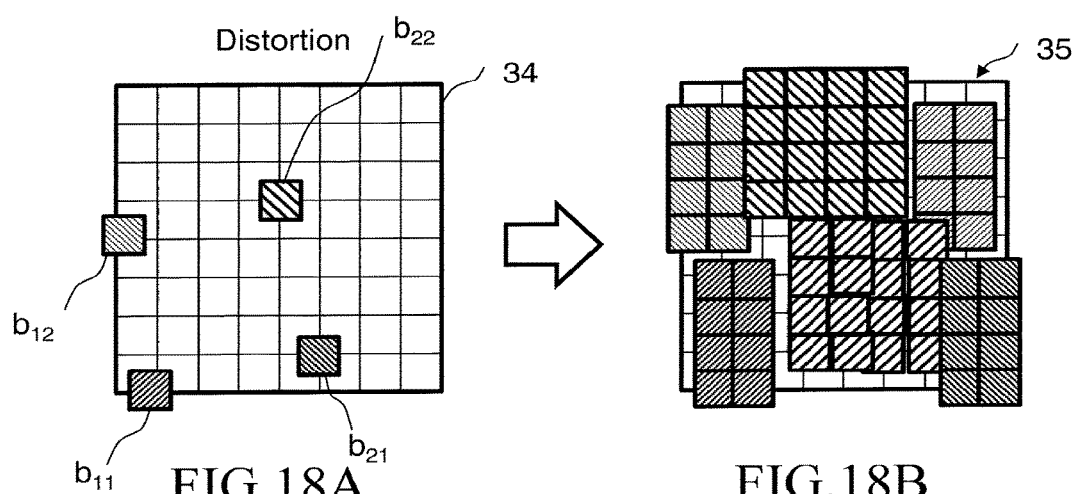
FIG.18A
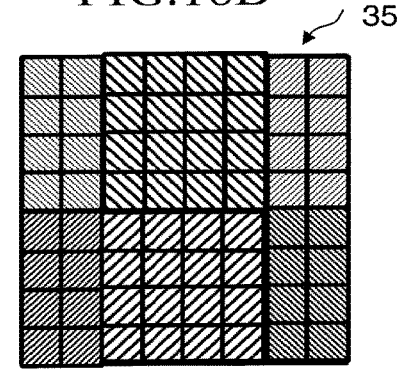
FIG.18B
FIG.18C

MULTIPLE CHARGED PARTICLE BEAM LITHOGRAPHY APPARATUS AND MULTIPLE CHARGED PARTICLE BEAM PATTERN WRITING METHOD

CROSS-REFERENCE TO RELATED APPLICATION

This application is based upon and claims the benefit of priority from prior Japanese Patent Application No. 2017-082861 filed on Apr. 19, 2017 in Japan, the entire contents of which are incorporated herein by reference.

BACKGROUND OF THE INVENTION

Field of the Invention

Embodiments described herein relate generally to a multiple charged particle beam lithography apparatus and a multiple charged particle beam pattern writing method and, for example, relate to a method of correcting a positional displacement or a dimensional displacement of a pattern caused by a positional displacement of a beam in multiple beams pattern writing by modulating a dose.

Related Art

A lithography technique, which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. An electron beam pattern writing technique has inherently superior resolution and a mask pattern is written to mask blanks using an electron beam.

For example, a lithography apparatus using multiple beams is known. Compared with a case in which one electron beam is used, many beams can be emitted at a time by using multiple beams so that throughput can be improved significantly. In such a lithography apparatus of multi-beam mode, for example, an electron beam emitted from an electron gun assembly is passed through a mask having a plurality of holes to form multiple beams, each beam is subjected to blanking control, and each beam that is not shielded is reduced by an optical system to reduce a mask image and deflected by a deflector before being shot at a desired position on a target object.

Here, in multiple beams pattern writing, a positional displacement of beam could arise due to a distortion of the optical system, a displacement of an aperture plate array to form multiple beams from design values, and/or the Coulomb effect. If a positional displacement of a beam constituting multiple beams arises, a problem that a written pattern also has a positional displacement and/or a dimensional displacement arises. Therefore, it is desirable to correct a positional displacement of an irradiation pattern formed with a positionally-displaced beam being irradiated. For a positional displacement of beam, for example, correcting the position of a formed irradiation pattern by allocating a dose to a designed irradiation position to its surroundings is proposed. Thus, operating a dose modulation value to a local region and a dose modulation value to its surrounding regions, creating a dose modulation map defined by these dose modulation values, and modulating the dose using the dose modulation map is proposed (see Published Unexamined Japanese Patent Application No. 2016-119423 (JP-A-2016-119423), for example).

In such a dose modulation map, however, not only data of the local region, but also data allocated from surrounding regions is defined for each unit region and thus, the amount of data is larger than the dose in a dose map. On the other hand, a lithography apparatus performs data processing and an actual pattern writing operation in real time like performing data processing for each fixed region such as a frame or a stripe and performing a pattern writing operation of the frame or stripe for which processing is completed. Thus, when the dose of each irradiation position is operated, it takes a considerable time for an arithmetic processor only to read data of such a dose modulation map from the main memory and a problem that memory bands of the main memory cannot catch up with an operating speed of dose arises. Therefore, a problem that a data processing speed slows and in turn, throughput of pattern writing processing deteriorates arises.

BRIEF SUMMARY OF THE INVENTION

According to one aspect of the present invention, a multiple charged particle beam lithography apparatus includes: dose modulation data calculation processing circuitry configured to calculate, for each of a plurality of pixel regions to be regions obtained by dividing a setting region of a size that does not exceed double size of multiple charged particle beams as a whole by a predetermined quantization dimension into a grid shape, a first dose modulation value of a beam into a target pixel region that corrects, by modulating a dose, a positional displacement of an irradiation pattern caused by a positional displacement of a beam with which the target pixel region is irradiated following a pattern writing sequence and a second dose modulation value to allocate a dose to at least one pixel region around the target pixel region; dose modulation map creation processing circuitry configured to create a dose modulation map in which a dose modulation value groups is defined for each of the pixel regions in the setting region such that, for each of the pixel regions, the first dose modulation value calculated of the beam to the target pixel region is defined in a position of the target pixel region and the second dose modulation value to allocate a dose to the at least one pixel region around the target pixel region is defined in a position of the at least one pixel region around the target pixel region by associating with the position of the target pixel region; dose operation processing circuitry configured to, in a case that a pattern is written into a pattern writing region sufficiently larger than the setting region in a target object by using the multiple charged particle beams following the pattern writing sequence, operate an incident dose of a beam to each position intended inside the pattern writing region by continuously using repeatedly data of dose modulation value groups defined for a plurality of pixel regions of a same block among a plurality of blocks obtained by dividing the dose modulation map for each preset number of pixel regions without switching to data of dose modulation value groups of other blocks; and a pattern writer configured to write a pattern to the target object using the multiple charged particle beams such that the each position is irradiated with a beam of the incident dose operated for each.

According to another aspect of the present invention, a multiple charged particle beam pattern writing method includes: calculating, for each of a plurality of pixel regions to be regions obtained by dividing a setting region of a size that does not exceed double that of multiple charged particle beams as a whole by a predetermined quantization dimension into a grid shape, a first dose modulation value of a beam into the target pixel region that corrects a positional displacement of an irradiation pattern caused by a positional displacement of a beam with which the target pixel region is irradiated following a pattern writing sequence and a second dose modulation value to allocate a dose to at least one pixel region around the target pixel region; creating a dose modulation map in which a dose modulation value group is defined for each of the pixel regions in the setting region such that, for each of the pixel regions, the first dose modulation value calculated of the beam to the target pixel region is defined in a position of the target pixel region and the second dose modulation value to allocate a dose to at least the one pixel region around the target pixel region is defined in a position of at least the one pixel region around the target pixel region by associating with the position of the target pixel region; operating, when a pattern is written into a pattern writing region sufficiently larger than the setting region in a target object by using the multiple charged particle beams following the pattern writing sequence, an incident dose of a beam to each position intended inside the pattern writing region by continuously using repeatedly data of dose modulation value groups defined for a plurality of pixel regions of a same block among a plurality of blocks obtained by dividing the dose modulation map for each preset number of pixel regions without switching to data of dose modulation value groups of other blocks; and writing a pattern to the target object using the multiple charged particle beams such that the each position is irradiated with a beam of the incident dose operated for each.

BRIEF DESCRIPTION OF THE DRAWINGS

FIG. 11 is a diagram showing an example of the dose modulation value with correction focusing on a pixel region of the first shot of multiple beams in Embodiment 1 and the dose modulation value when allocated to surrounding pixel regions;

FIG. 12 is a diagram showing an example of the dose modulation value with correction focusing on a pixel region of the second shot of multiple beams in Embodiment 1 and the dose modulation value when allocated to surrounding pixel regions;

FIGS. 18A to 18C are diagrams illustrating differences of pattern writing positions depending on whether the dose is corrected in Embodiment 1;

DETAILED DESCRIPTION OF THE INVENTION

In the embodiments described below, multiple charged particle beam lithography apparatuses and pattern writing methods capable of increasing the speed of data processing while correcting positional displacement and/or dimensional displacement of a pattern formed by being irradiated with multiple beams containing a positionally-displaced beam will be described.

In the embodiments described below, the configuration using an electron beam will be described as an example of a charged particle beam. However, the charged particle beam is not limited to an electron beam, and a beam such as an ion beam using charged particles may be used.

Embodiment 1

Figure 1:
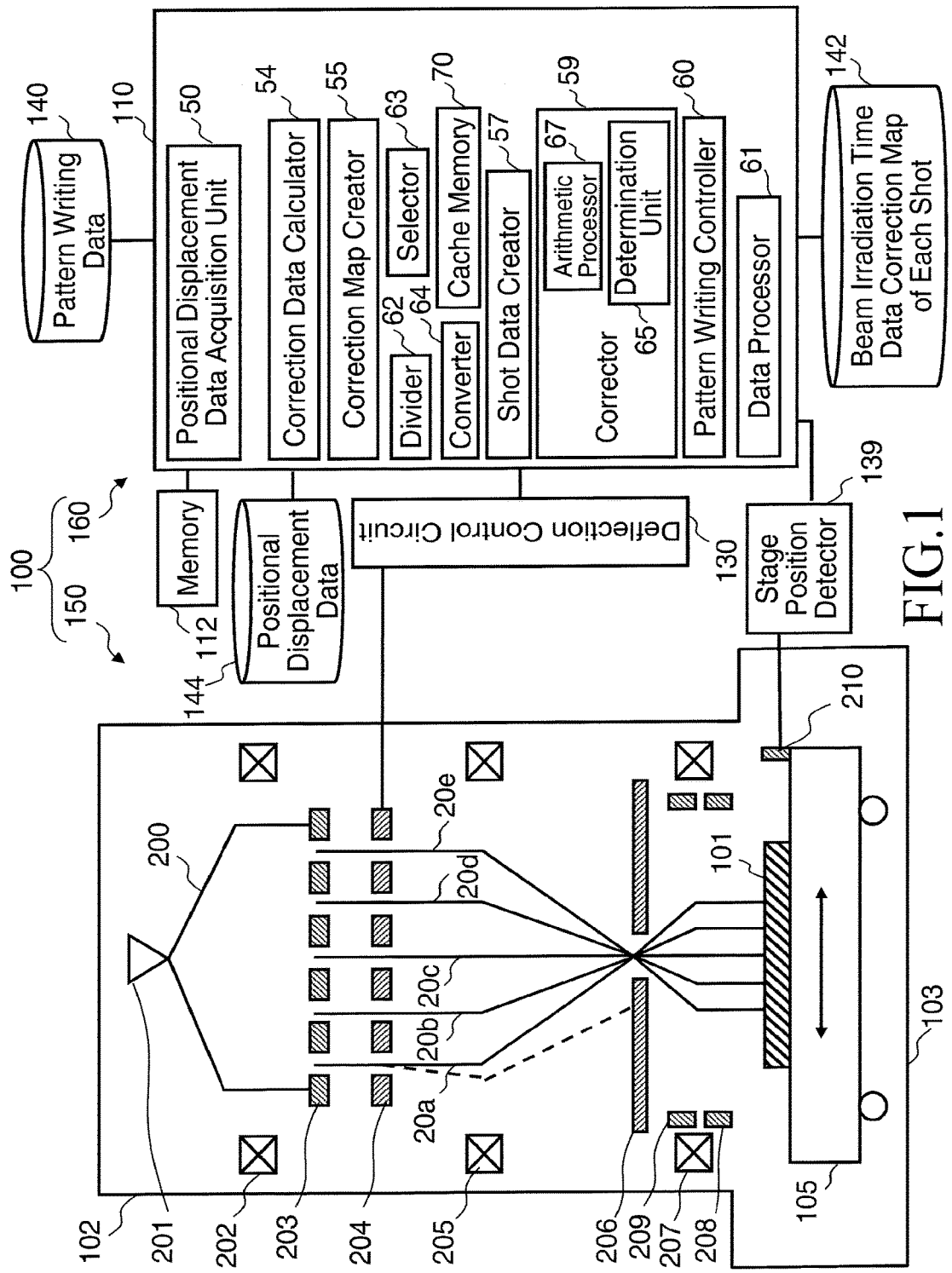
FIG. 1 is a conceptual diagram showing a configuration of a lithography apparatus according to Embodiment 1.

FIG. 1 is a conceptual diagram showing a configuration of a lithography apparatus according to Embodiment 1; In FIG. 1, a lithography apparatus 100 includes a pattern writer 150 being a pattern generator and a control system circuit 160 being a controller. The lithography apparatus 100 is an example of the multiple charged particle beam lithography apparatus. The pattern writer 150 includes an electron optical column 102 and a pattern writing chamber 103. Inside the electron optical column 102, an electron gun assembly 201, an illumination lens 202, a shaping aperture plate array substrate 203, a blanking aperture array mechanism 204, a reducing lens 205, a limiting aperture plate substrate 206, an objective lens 207, a main deflector 208, and a sub-deflector 209 are arranged. An XY stage 105 is arranged inside the pattern writing chamber 103. A target object 101 such as mask blanks to be a substrate intended for pattern writing while a pattern is written is arranged on the XY stage 105.

The target object 101 includes an exposure mask for manufacturing semiconductor devices or a semiconductor substrate (silicon wafer) on which semiconductor devices are manufactured. Further, a mirror 210 for position measurement of the XY stage 105 is arranged on the XY stage 105.

The control system circuit 160 includes a control computer 110, a memory 112, a deflection control circuit 130, a stage position detector 139, and storage devices 140, 142, and 144 such as magnetic disk drives. The control computer 110, the memory 112, the deflection control circuit 130, the stage position detector 139, and the storage devices 140, 142, and 144 are mutually connected via a bus (not shown). The storage device 140 (data storage unit) stores pattern writing data input from outside.

In the control computer 110, a positional displacement data acquisition unit 50, a correction data calculator 54, a correction map creator 55, a shot data creator 57, a corrector 59, a pattern writing controller 60, a data processor 61, a divider 62, a selector 63, a converter 64, and a cache memory 70 are arranged. The corrector 59 includes an arithmetic processor 67 and a determination unit 65 as an internal configuration. Each of "unit", "creator", "corrector", "controller", "processor", "divider", "selector", and "converter" such as the positional displacement data acquisition unit 50, the correction data calculator 54, the correction map creator 55, the shot data creator 57, the corrector 59 (the arithmetic processor 67 and the determination unit 65), the pattern writing controller 60, the data processor 61, the divider 62, the selector 63, and the converter 64 includes processing circuitry. Such processing circuits include, for example, electric circuits, computers, processors, circuit substrates, quantum circuits, and semiconductor devices. As each of "unit", "creator", "corrector", "controller", "processor", "divider", "selector", and "converter", a common processing circuit (the same processing circuit) may be used or different processing circuits (separate processing circuits) may be used. Information input into or output from the positional displacement data acquisition unit 50, the correction data calculator 54, the correction map creator 55, the shot data creator 57, the corrector 59 (the arithmetic processor 67 and the determination unit 65), the pattern writing controller 60, the data processor 61, the divider 62, the selector 63, and the converter 64 and information during operation are each time stored in the memory 112.

Here, in FIG. 1, only the configuration needed to describe Embodiment 1 is shown. Other configurations normally needed for the lithography apparatus 100 may also be included.

Figure 2A:
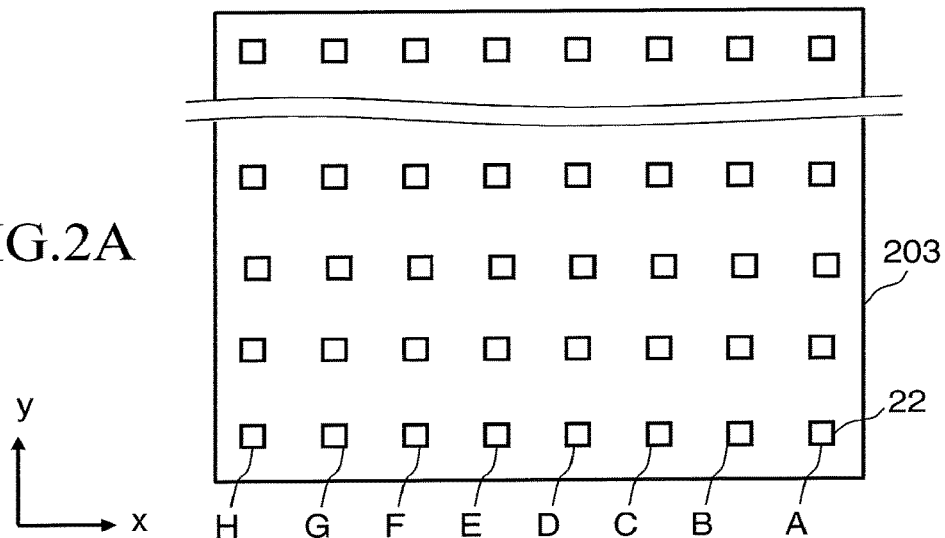
FIGS. 2A and 2B are conceptual diagrams showing the configuration of a shaping aperture plate array substrate according to Embodiment 1.
Figure 2B:
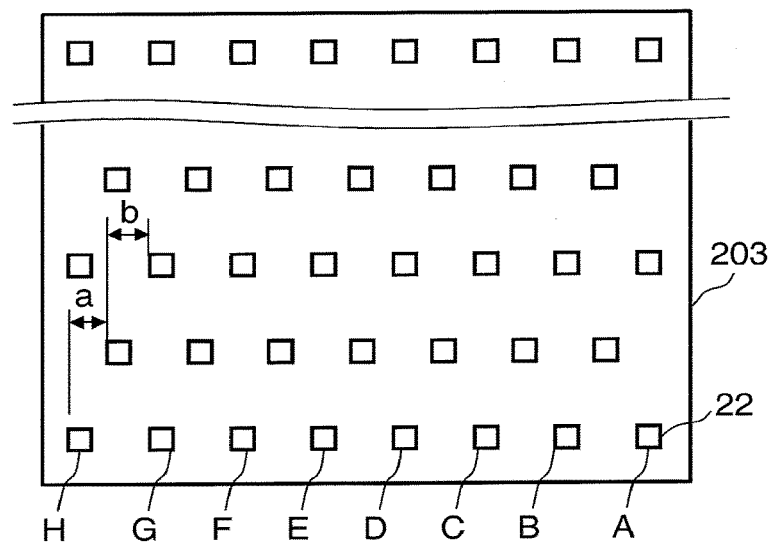

FIGS. 2A and 2B are conceptual diagrams showing the configuration of a shaping aperture plate array substrate according to Embodiment 1; In FIG. 2A, the shaping aperture plate array substrate 203 has holes (openings) 22 of m rows long (y direction)×n rows wide (x direction) (m, n≥2) formed with predetermined arrangement pitches in a matrix of rows and columns. In FIG. 2A, for example, the 512×8 holes 22 are formed. Each of the holes 22 is formed in a rectangular of the same dimensions. Alternatively, each of the holes 22 may be formed in a circular shape of the same outside diameter. Here, an example in which the eight holes 22 from A to H are formed in the x direction for each row in the y direction is shown. Multiple beams 20 are formed by a portion of an electron beam 200 being passed through a plurality of these holes 22. Here, an example in which the holes 22 having the length and the width of two rows or more are arranged (x, y directions) is shown, but the present embodiment is not limited to such an example. In addition, for example, a plurality of rows may be included in the length or the width (x or y direction) and only one row may be arranged in the other. Also, the method of arranging the holes 22 is not limited to a case of arranging holes in a grid shape like in FIG. 2A. For example, as shown in FIG. 2B, the holes in the first row and the second row in the length direction (y direction) may be arranged by being shifted by a dimension a in the width direction (x direction) from each other. Similarly, the second row and the third row in the length direction (y direction) may be arranged by being shifted by a dimension b in the width direction (x direction) from each other.

Figure 3:
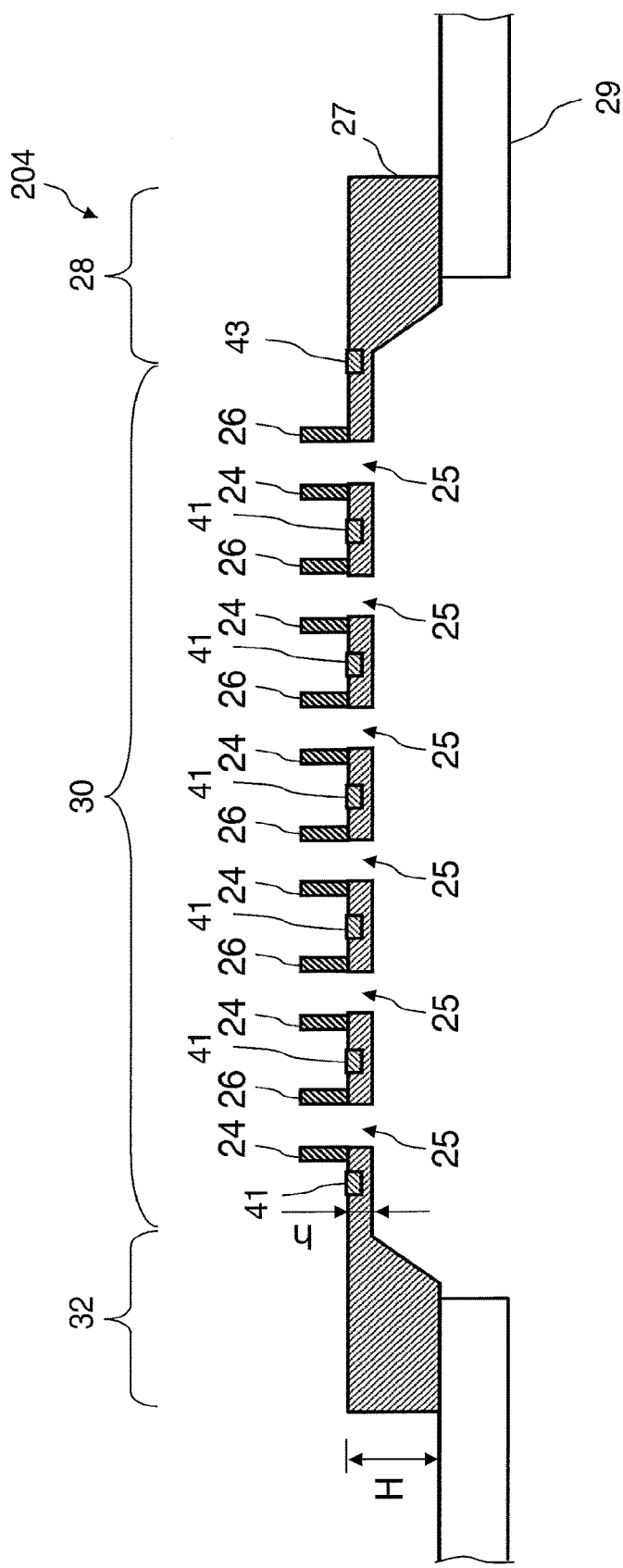
FIG. 3 is a sectional view showing the configuration of a blanking aperture array mechanism according to Embodiment 1.

FIG. 3 is a sectional view showing the configuration of a blanking aperture array mechanism according to Embodiment 1.

Figure 4:
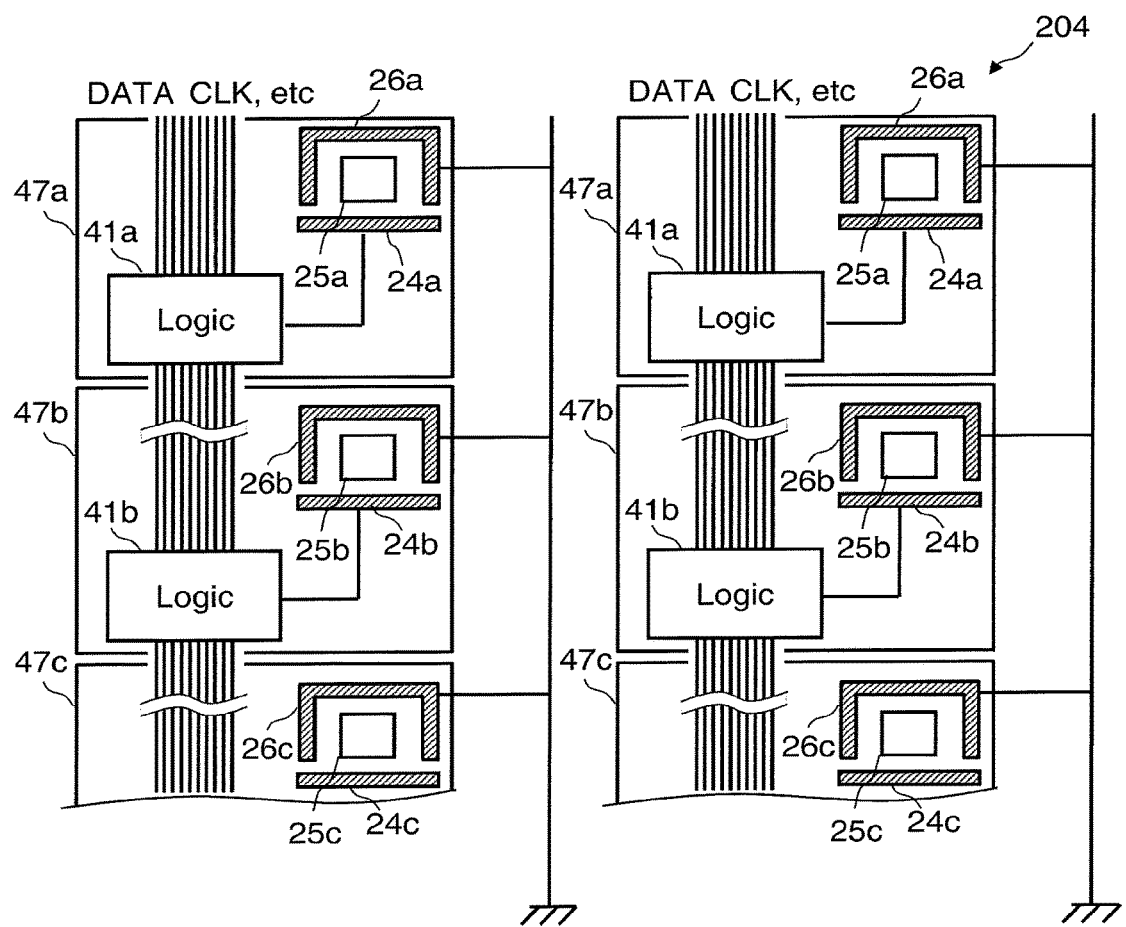
FIG. 4 is a top conceptual diagram showing a portion of the configuration inside a membrane region of the blanking aperture array mechanism according to Embodiment 1.

FIG. 4 is a top conceptual diagram showing a portion of the configuration inside a membrane region of the blanking aperture array mechanism according to Embodiment 1; In FIGS. 3 and 4, the physical relationship among a control electrode 24, a counter electrode 26, and control circuits 41 and 43 does not correspond to the actual physical relationship. The blanking aperture array mechanism 204 has, as shown in FIG. 3, a semiconductor substrate (substrate 27) made of silicon and the like arranged on a fulcrum 29. The center portion of the substrate 27 is, for example, thinly cut from the back side and processed into a membrane region 30 (first region) of a thin thickness h. The periphery surrounding the membrane region 30 is an outer circumferential region 28 (second region) of a thick thickness H. The top surface of the membrane region 30 and the top surface of the outer circumferential region 28 are formed so as to have the same height or substantially the same height. The substrate 27 is held on the fulcrum 29 on the back side of the outer circumferential region 28. The center portion of the fulcrum 29 is open and the membrane region 30 is positioned in a region where the fulcrum 29 is open.

The membrane region 30 has a passing hole 25 (opening) for passing of each beam of multiple beams opened in a position corresponding to each of the holes 22 of the shaping aperture plate array substrate 203 shown in FIG. 2A or FIG. 2B. Then, as shown in FIGS. 3 and 4, an individual blanking mechanism 47 which is a pair of blankers of the control electrode 24 and the counter electrode 26 for blanking deflection is arranged in the membrane region 30 across the passing hole 25 corresponding to a neighborhood position of each of the passing holes 25. Also, the control circuit 41 (logic circuit) that applies a deflecting voltage to the control electrode 24 for each of the passing holes 25 is arranged in the neighborhood of each of the passing holes 25 in the membrane region 30. The counter electrode 26 for each beam is ground-connected.

Also, as shown in FIG. 4, for example, an N-bit (for example, 10-bit) parallel wire for control signal is connected to each of the control circuits 41. In addition to the N-bit parallel wire for control, a clock signal line and a power wire, respectively for control purpose are connected to each of the control circuits 41. A portion of the parallel wire may be used for the clock signal line or the power wire. An individual blanking mechanism 47 by the control electrode 24, the counter electrode 26, and the control circuit 41 is configured for each beam constituting multiple beams. In the example of FIG. 3, the control electrode 24, the counter electrode 26, and the control circuit 41 are arranged in the membrane region 30 where the thickness of the substrate 27 is thin. However, the present embodiment is not limited to such an example.

The electron beam 200 passes through each of the passing holes 25 to be deflected by voltages of the two electrodes 24 and 26 forming a pair applied independently. Blanking control is exercised by such deflection. In other words, a pair of the control electrode 24 and the counter electrode 26 deflects by blanking a corresponding beam of multiple beams having passed through the plurality of the holes 22 of the shaping aperture plate array substrate 203.

Next, the operation of the pattern writer 150 in the lithography apparatus 100 will be described. The electron beam 200 emitted from the electron gun assembly 201 (emitting unit) illuminates the entire shaping aperture plate array substrate 203 almost vertically through the illumination lens 202. The shaping aperture plate array substrate 203 has a plurality of rectangular holes formed therein, for example, and the electron beam 200 illuminates a region including all the plurality of holes 22. Multiple beams 20a to 20e in, for example, a rectangular shape are formed by each portion of the electron beams 200 with which the positions of the plurality of holes are irradiated being passed through each of the plurality of holes 22 of the shaping aperture plate array substrate 203. The multiple beams 20a to 20e pass through the respective corresponding individual blanking mechanism 47a to 47e of the blanking aperture array mechanism 204. Such individual blanking mechanism 47 individually deflects by blanking each beam of the multiple beams 20 which are passing individually.

The multiple beams 20a to 20e having passed through the blanking aperture array mechanism 204 are reduced by the reducing lens 205 before traveling toward a hole in the center formed in the limiting aperture plate substrate 206. Here, the multiple beams 20a to 20e deflected by the individual blanking mechanism 47 of the blanking aperture array mechanism 204 deviates from the position of the hole in the center of the limiting aperture plate substrate 206 and is shielded by the limiting aperture plate substrate 206. On the other hand, the electron beam 20 that is not deflected by the individual blanking mechanism 47 of the blanking aperture array mechanism 204 passes, as shown in FIG. 1, through the hole in the center of the limiting aperture plate substrate 206. The blanking control is exercised by ON/OFF of the individual blanking mechanism to control ON/OFF of a beam. In this manner, the limiting aperture plate substrate 206 shields each beam deflected so as to be in a beam OFF state by the individual blanking mechanism 47. Then, a beam for one shot is formed for each beam by a beam formed between beam ON and beam OFF and having passed through the limiting aperture plate substrate 206. The multiple beams 20 having passed through the limiting aperture plate substrate 206 are focused by the objective lens 207 to become a pattern image of a desired reduction ratio and multiple beams 20a to 20e having passed through the limiting aperture plate substrate 206 is deflected collectively in the same direction by the main deflector 208 and the sub-deflector 209 and targeted at the irradiation position of each beam on the target object 101. When, for example, the XY stage 105 moves continuously, the irradiation position of a beam is controlled by the main deflector 208 so as to track the movement of the XY stage 105. The position of the XY stage 105 is measured by aiming a laser from the stage position detector 139 at the mirror 210 on the XY stage 105 and using a reflected light thereof. The multiple beams 20 emitted at a time are ideally arranged with pitches obtained by multiplying the arrangement pitch of the plurality of holes of the shaping aperture plate array substrate 203 by the above desired reduction ratio. The lithography apparatus 100 emits the multiple beams 20 to be a shot beam successively pixel by pixel by moving the beam deflection position through the sub-deflector 209 while tracking the movement of the XY stage 105 by the main deflector 208 during each tracking operation. When a desired pattern is written, a needed beam is controlled to beam ON by blanking control in accordance with the pattern.

Figure 5:
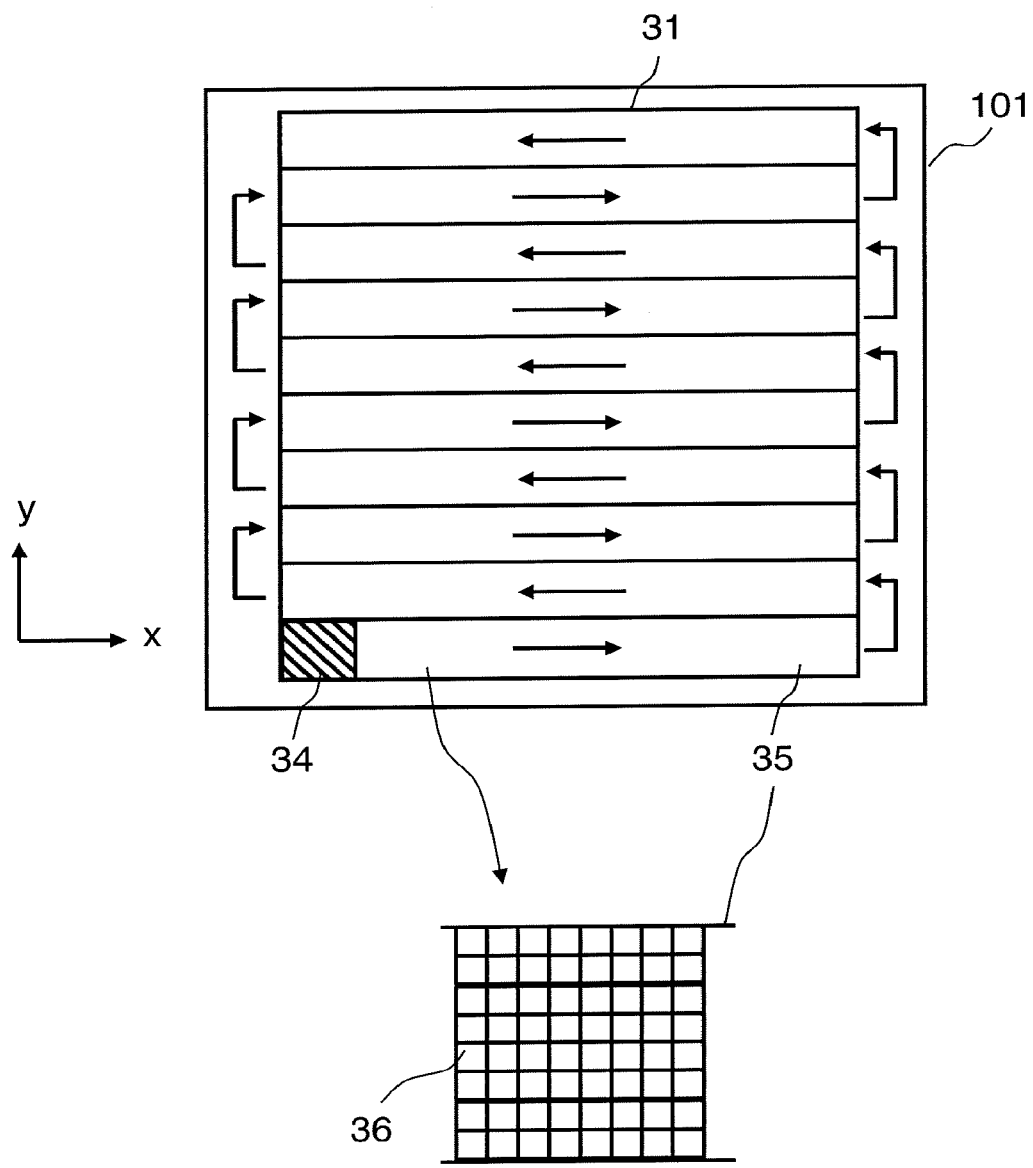
FIG. 5 is a diagram illustrating a pattern writing order according to Embodiment 1.

FIG. 5 is a diagram illustrating a pattern writing order according to Embodiment 1; In FIG. 5, a pattern writing region 31 (for example, a chip region) of the target object 101 is divided, for example, into a plurality of stripe regions 35 in a thin rectangular shape of a predetermined width in the y direction. For example, the pattern writing region 31 is divided into the plurality of stripe regions 35 in a thin rectangular shape of the width of an irradiation region 34 that can be irradiated with one shot of the multiple beams 20 as a whole. More specifically, the irradiation region 34 is set to a size obtained by multiplying beam pitches Px, Py between beams adjacent in the x, y directions of the multiple beams 20 by beam numbers n, m in the x, y directions respectively (Px·n)×(Py·m).

Each of the stripe regions 35 becomes a pattern writing unit region. First, the XY stage 105 is moved to adjust such that the irradiation region 34 of the multiple beams 20 is positioned in a pattern writing start position of the first stripe region 35 before pattern writing being started. When a pattern is written to the first stripe region 35, the XY stage 105 is moved in, for example, the −x direction to continue to write the pattern relatively in the x direction. The XY stage 105 is moved at a predetermined speed, for example, continuously. After pattern writing of the first stripe region 35 is finished, the stage position is moved in the −y direction to adjust such that the irradiation region 34 is positioned on the right end of the second stripe region 35 or in a position further to the right relatively in the y direction, and this time, the XY stage 105 is moved in, for example, the x direction for pattern writing in the same manner toward the −x direction. The pattern writing time can be shortened by alternately changing the direction of pattern writing like writing a pattern toward the x direction in the third stripe region 35 and writing a pattern toward the −x direction in the fourth stripe region 35. However, the present embodiment is not limited to a case of alternately changing the pattern writing direction and when a pattern is written to each of the stripe regions 35, pattern writing may proceed in the same direction. In a shot, a plurality of shot patterns as many as the number of the holes 22 is maximally formed at a time by multiple beams formed by passing each of the holes 22 of the shaping aperture plate array substrate 203.

When a chip pattern is written, such a chip region becomes the pattern writing region 31. When a plurality of chip regions is written under the same pattern writing conditions, such as, under the condition that base doses are the same for example, a chip region obtained by performing merge processing of the plurality of chip regions may be set as the pattern writing region 31. In FIG. 5, one pattern writing region 31 is shown, but the present embodiment is not limited to such an example. When a plurality of chip patterns is written under different pattern writing conditions, a plurality of pattern writing regions 31 is set for each chip region written under the same pattern writing conditions. Then, each of the stripe regions 35 is virtually divided into pixels 36 being a plurality of mesh regions. The size of the pixel 36 is suitably, for example, a size equal to the beam size or less. For example, the size is suitably set to about 10 nm. The pixel 36 becomes an irradiation unit region per beam of multiple beams.

FIGS. 6A to 6D are diagrams illustrating a portion of a shot order to write a pattern to a stripe region according to Embodiment 1.

FIGS. 7A to 7D are diagrams illustrating a remaining portion of the shot order to write a pattern to stripe regions according to Embodiment 1; In the examples of FIGS. 6A to 6D and FIGS. 7A to 7D, a case in which a pattern is written by multiple beams of, for example, 2×2 to simplify the description. Also in the examples of FIGS. 6A to 6D and FIGS. 7A to 7D, a case in which beam pitches Px, Py between beams adjacent in the x, y directions of the multiple beams 20 are set to the size of four pixels respectively is shown. Thus, in the examples of FIGS. 6A to 6D and FIGS. 7A to 7D, the irradiation region 34 that can be irradiated with one shot of the multiple beams 20 as a whole is shown as a region of 8×8 pixels. Also, in the examples of FIGS. 6A to 6D and FIGS. 7A to 7D, a case in which pattern writing of one stripe region 35 is finished after seven tracking operations (tracking cycles) is shown.

Figure 6A:
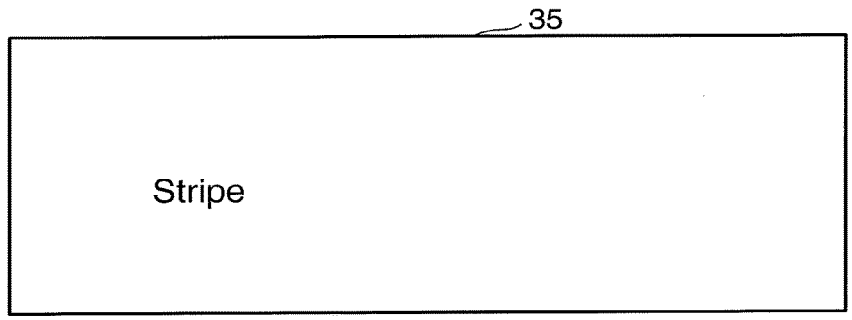
FIGS. 6A to 6D are diagrams illustrating a portion of a shot order to write a pattern to a stripe region according to Embodiment 1.
Figure 6B:
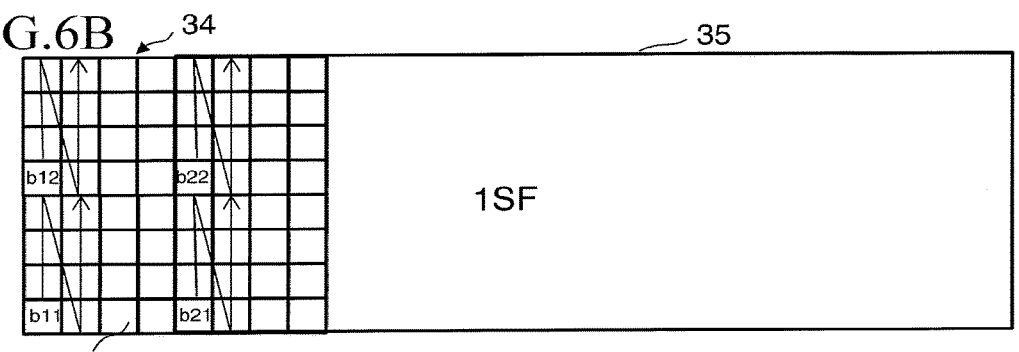

In FIG. 6A, one stripe region 35 is shown. Then, as shown in FIG. 6B, the irradiation region 34 of the multiple beams 20 is set such that, for example, half (right half) in the x direction of the irradiation region 34 overlaps with the stripe region 35 from the left end. As described above, a tracking operation is performed when a pattern is written to the target object 101 using the multiple beams 20 and such a position becomes a pattern writing start position to perform the first tracking operation being 1SF.

When a pattern is written to the target object 101 using the multiple beams 20, as described above, the position shown in FIG. 6B is maintained while tracking the movement of the XY stage 105 with the main deflector 208 as a tracking operation. The multiple beams 20 as a whole are collectively deflected by the sub-deflector 209 in such a state to make adjustments so that a pixel region 38 of the first row in the y direction and the first column in the x direction of the irradiation region 34 is irradiated with a beam b11, a pixel region of the first row in the y direction and the fifth column in the x direction of the irradiation region 34 is irradiated with a beam b21, a pixel region 38 of the fifth row in the y direction and the first column in the x direction of the irradiation region 34 is irradiated with a beam b12, and a pixel region 38 of the fifth row in the y direction and the fifth column in the x direction of the irradiation region 34 is irradiated with a beam b22. Then, in the above position, the first shot of the multiple beams 20 is targeted. Subsequently, while the irradiation region 34 is maintained in the position of FIG. 6B by tracking operation, the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel region 38 of the first row in the y direction and the second column in the x direction of the irradiation region 34 is irradiated with the beam b11, a pixel region 38 of the first row in the y direction and the sixth column in the x direction of the irradiation region 34 is irradiated with the beam b21, a pixel region 38 of the fifth row in the y direction and the second column in the x direction of the irradiation region 34 is irradiated with the beam b12, and a pixel region 38 of the fifth row in the y direction and the sixth column in the x direction of the irradiation region 34 is irradiated with the beam b22. Then, similarly, the fifth to eighth shots are each targeted by shifting in the y direction by one pixel.

Figure 6C:
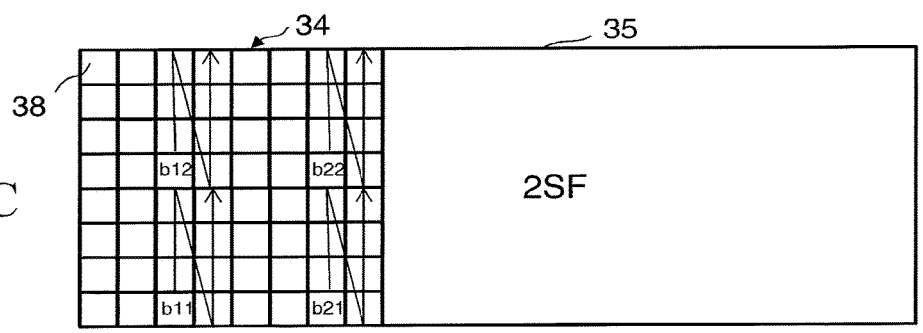

Next, as shown in FIG. 6C, the multiple beams 20 are collectively deflected to move the irradiation region 34 to a position shifted by the main deflector 208 in the x direction by four pixels where the second tracking operation being 2SF is performed. The multiple beams 20 as a whole are collectively deflected by the sub-deflector 209 in such a state to make adjustments so that a pixel region 38 of the first row in the y direction and the third column in the x direction of the irradiation region 34 is irradiated with the beam b11, a pixel region 38 of the first row in the y direction and the seventh column in the x direction of the irradiation region 34 is irradiated with the beam b21, a pixel region 38 of the fifth row in the y direction and the third column in the x direction of the irradiation region 34 is irradiated with the beam b12, and a pixel region 38 of the fifth row in the y direction and the seventh column in the x direction of the irradiation region 34 is irradiated with the beam b22. Then, in the above position, the first shot of the multiple beams 20 is targeted. Subsequently, while the irradiation region 34 is maintained in the position of FIG. 6C by tracking operation, the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel region 38 of the first row in the y direction and the fourth column in the x direction of the irradiation region 34 is irradiated with the beam b11, a pixel region 38 of the first row in the y direction and the eighth column in the x direction of the irradiation region 34 is irradiated with the beam b21, a pixel region 38 of the fifth row in the y direction and the fourth column in the x direction of the irradiation region 34 is irradiated with the beam b12, and a pixel region 38 of the fifth row in the y direction and the eighth column in the x direction of the irradiation region 34 is irradiated with the beam b22. Then, similarly, the fifth to eighth shots are each targeted by shifting in the y direction by one pixel.

Figure 6D:
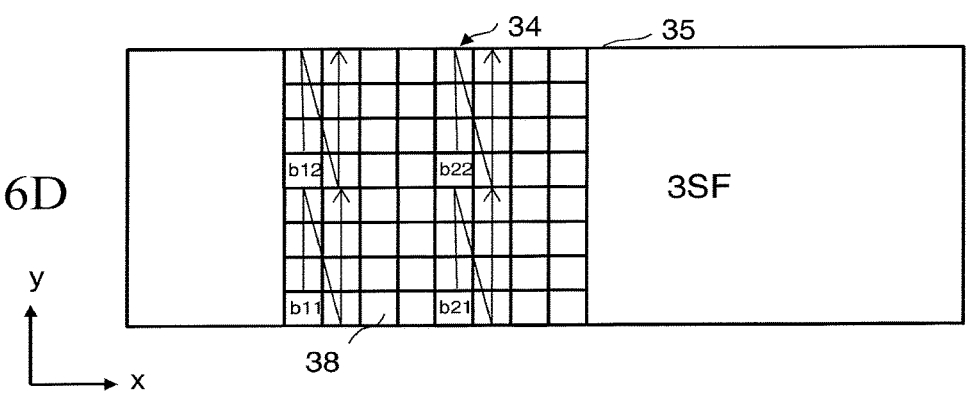

Next, as shown in FIG. 6D, the multiple beams 20 are collectively deflected to move the irradiation region 34 to a position shifted by the main deflector 208 in the x direction by four pixels where the third tracking operation being 3SF is performed. The multiple beams 20 as a whole are collectively deflected by the sub-deflector 209 in such a state to make adjustments so that a pixel region 38 of the first row in the y direction and the first column in the x direction of the irradiation region 34 is irradiated with the beam b11, a pixel region 38 of the first row in the y direction and the fifth column in the x direction of the irradiation region 34 is irradiated with the beam b21, a pixel region 38 of the fifth row in the y direction and the first column in the x direction of the irradiation region 34 is irradiated with the beam b12, and a pixel region 38 of the fifth row in the y direction and the fifth column in the x direction of the irradiation region 34 is irradiated with the beam b22. Then, in the above position, the first shot of the multiple beams 20 is targeted. Subsequently, while the irradiation region 34 is maintained in the position of FIG. 6D by tracking operation, the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel of the first row in the y direction and the second column in the x direction of the irradiation region 34 is irradiated with the beam b11, a pixel region 38 of the first row in the y direction and the sixth column in the x direction of the irradiation region 34 is irradiated with the beam b21, a pixel region 38 of the fifth row in the y direction and the second column in the x direction of the irradiation region 34 is irradiated with the beam b12, and a pixel region 38 of the fifth row in the y direction and the sixth column in the x direction of the irradiation region 34 is irradiated with the beam b22. Then, similarly, the fifth to eighth shots are each targeted by shifting in the y direction by one pixel.

Figure 7A:
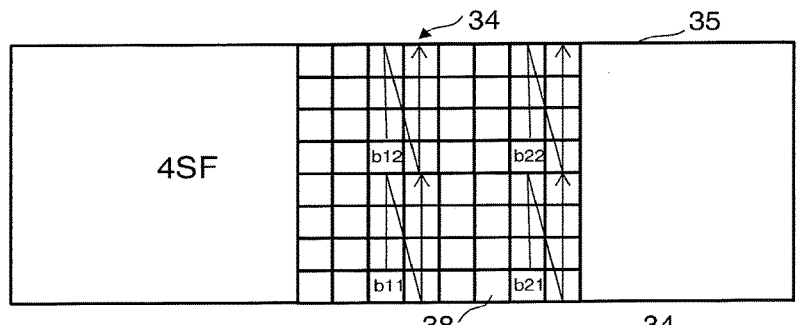
FIGS. 7A to 7D are diagrams illustrating a remaining portion of the shot order to write a pattern to stripe regions according to Embodiment 1.

Next, as shown in FIG. 7A, the multiple beams 20 are collectively deflected to move the irradiation region 34 to a position shifted by the main deflector 208 in the x direction by four pixels where the fourth tracking operation being 4SF is performed. The multiple beams 20 as a whole are collectively deflected by the sub-deflector 209 in such a state to make adjustments so that a pixel region 38 of the first row in the y direction and the third column in the x direction of the irradiation region 34 is irradiated with the beam b11, a pixel region 38 of the first row in the y direction and the seventh column in the x direction of the irradiation region 34 is irradiated with the beam b21, a pixel region 38 of the fifth row in the y direction and the third column in the x direction of the irradiation region 34 is irradiated with the beam b12, and a pixel region 38 of the fifth row in the y direction and the seventh column in the x direction of the irradiation region 34 is irradiated with the beam b22. Then, in the above position, the first shot of the multiple beams 20 is targeted. Subsequently, while the irradiation region 34 is maintained in the position of FIG. 7A by tracking operation, the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel region 38 of the first row in the y direction and the fourth column in the x direction of the irradiation region 34 is irradiated with the beam b11, a pixel region 38 of the first row in the y direction and the eighth column in the x direction of the irradiation region 34 is irradiated with the beam b21, a pixel region 38 of the fifth row in the y direction and the fourth column in the x direction of the irradiation region 34 is irradiated with the beam b12, and a pixel region 38 of the fifth row in the y direction and the eighth column in the x direction of the irradiation region 34 is irradiated with the beam b22. Then, similarly, the fifth to eighth shots are each targeted by shifting in the y direction by one pixel.

Figure 7B:
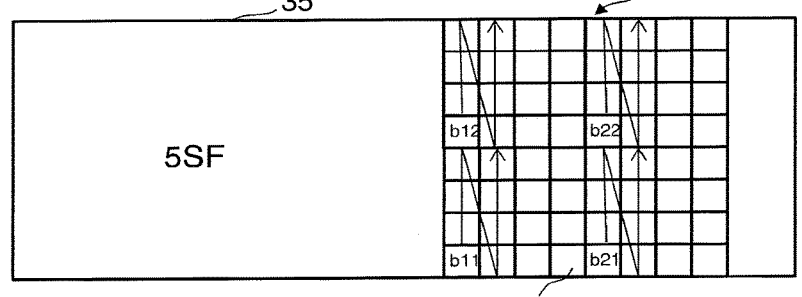

Next, as shown in FIG. 7B, the multiple beams 20 are collectively deflected to move the irradiation region 34 to a position shifted by the main deflector 208 in the x direction by four pixels where the fifth tracking operation (5SF) is performed. The multiple beams 20 as a whole are collectively deflected by the sub-deflector 209 in such a state to make adjustments so that a pixel region 38 of the first row in the y direction and the first column in the x direction of the irradiation region 34 is irradiated with the beam b11, a pixel region 38 of the first row in the y direction and the fifth column in the x direction of the irradiation region 34 is irradiated with the beam b21, a pixel region 38 of the fifth row in the y direction and the first column in the x direction of the irradiation region 34 is irradiated with the beam b12, and a pixel region 38 of the fifth row in the y direction and the fifth column in the x direction of the irradiation region 34 is irradiated with the beam b22. Then, in the above position, the first shot of the multiple beams 20 is targeted. Subsequently, while the irradiation region 34 is maintained in the position of FIG. 7B by tracking operation, the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel region 38 of the first row in the y direction and the second column in the x direction of the irradiation region 34 is irradiated with the beam b11, a pixel region 38 of the first row in the y direction and the sixth column in the x direction of the irradiation region 34 is irradiated with the beam b21, a pixel region 38 of the fifth row in the y direction and the second column in the x direction of the irradiation region 34 is irradiated with the beam b12, and a pixel region 38 of the fifth row in the y direction and the sixth column in the x direction of the irradiation region 34 is irradiated with the beam b22. Then, similarly, the fifth to eighth shots are each targeted by shifting in the y direction by one pixel.

Figure 7C:
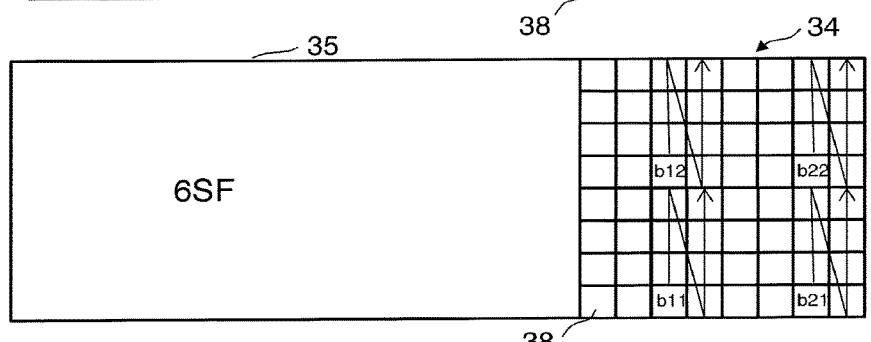

Next, as shown in FIG. 7C, the multiple beams 20 are collectively deflected to move the irradiation region 34 to a position shifted by the main deflector 208 in the x direction by four pixels where the sixth tracking operation (6SF) is performed. The multiple beams 20 as a whole are collectively deflected by the sub-deflector 209 in such a state to make adjustments so that a pixel region 38 of the first row in the y direction and the third column in the x direction of the irradiation region 34 is irradiated with the beam b11, a pixel region 38 of the first row in the y direction and the seventh column in the x direction of the irradiation region 34 is irradiated with the beam b21, a pixel region 38 of the fifth row in the y direction and the third column in the x direction of the irradiation region 34 is irradiated with the beam b12, and a pixel region 38 of the fifth row in the y direction and the seventh column in the x direction of the irradiation region 34 is irradiated with the beam b22. Then, in the above position, the first shot of the multiple beams 20 is targeted. Subsequently, while the irradiation region 34 is maintained in the position of FIG. 7C (during tracking operation), the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel region 38 of the first row in the y direction and the fourth column in the x direction of the irradiation region 34 is irradiated with the beam b11, a pixel region 38 of the first row in the y direction and the eighth column in the x direction of the irradiation region 34 is irradiated with the beam b21, a pixel region 38 of the fifth row in the y direction and the fourth column in the x direction of the irradiation region 34 is irradiated with the beam b12, and a pixel region 38 of the fifth row in the y direction and the eighth column in the x direction of the irradiation region 34 is irradiated with the beam b22. Then, similarly, the fifth to eighth shots are each targeted by shifting in the y direction by one pixel.

Figure 7D:
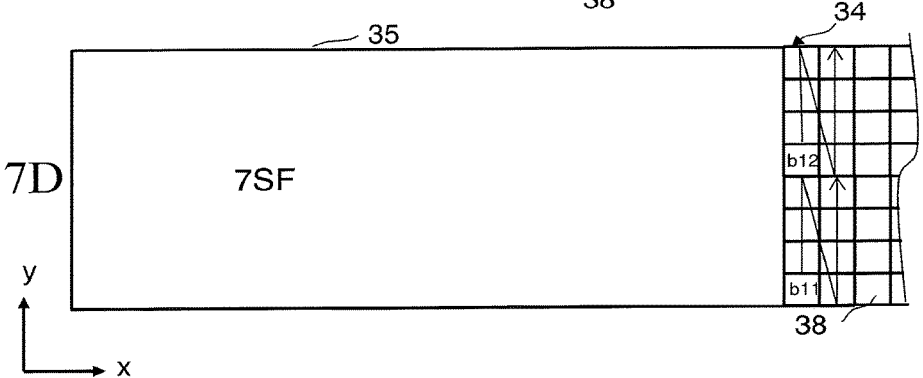

Next, as shown in FIG. 7D, the multiple beams 20 are collectively deflected to move the irradiation region 34 to a position shifted by the main deflector 208 in the x direction by four pixels where the seventh tracking operation (7SF) is performed. The multiple beams 20 as a whole are collectively deflected by the sub-deflector 209 in such a state to make adjustments so that a pixel region 38 of the first row in the y direction and the first column in the x direction of the irradiation region 34 is irradiated with the beam b11, a pixel region 38 of the first row in the y direction and the fifth column in the x direction of the irradiation region 34 is irradiated with the beam b21, a pixel region 38 of the fifth row in the y direction and the first column in the x direction of the irradiation region 34 is irradiated with the beam b12, and a pixel region 38 of the fifth row in the y direction and the fifth column in the x direction of the irradiation region 34 is irradiated with the beam b22. Then, in the above position, the first shot of the multiple beams 20 is targeted. Subsequently, while the irradiation region 34 is maintained in the position of FIG. 7D by tracking operation, the multiple beams 20 as a whole are collectively deflected by the sub-deflector 209 in the y direction by one pixel and in the above position, the second shot of the multiple beams 20 is targeted. After four shots are targeted by a similar operation, the multiple beams 20 are collectively deflected by the sub-deflector 209 so that a pixel region 38 of the first row in the y direction and the second column in the x direction of the irradiation region 34 is irradiated with the beam b11, a pixel region 38 of the first row in the y direction and the sixth column in the x direction of the irradiation region 34 is irradiated with the beam b21, a pixel region 38 of the fifth row in the y direction and the second column in the x direction of the irradiation region 34 is irradiated with the beam b12, and a pixel region 38 of the fifth row in the y direction and the sixth column in the x direction of the irradiation region 34 is irradiated with the beam b22. Then, similarly, the fifth to eighth shots are each targeted by shifting in the y direction by one pixel.

In the manner described above, pattern writing of the one stripe region 35 is finished. If a beam whose irradiation position is a position that does not need to be irradiated exists in each shot, the relevant beam may be turned off. Here, an example of deflecting in the y direction so that the shot order continues in the y direction is shown, but the present embodiment is not limited to such an example. In addition, for example, multiple beams may be deflected in the x direction so that the shot order continues in the x direction. In addition, multiple beams may be deflected randomly so that the shot order does not continue.

Figure 8:
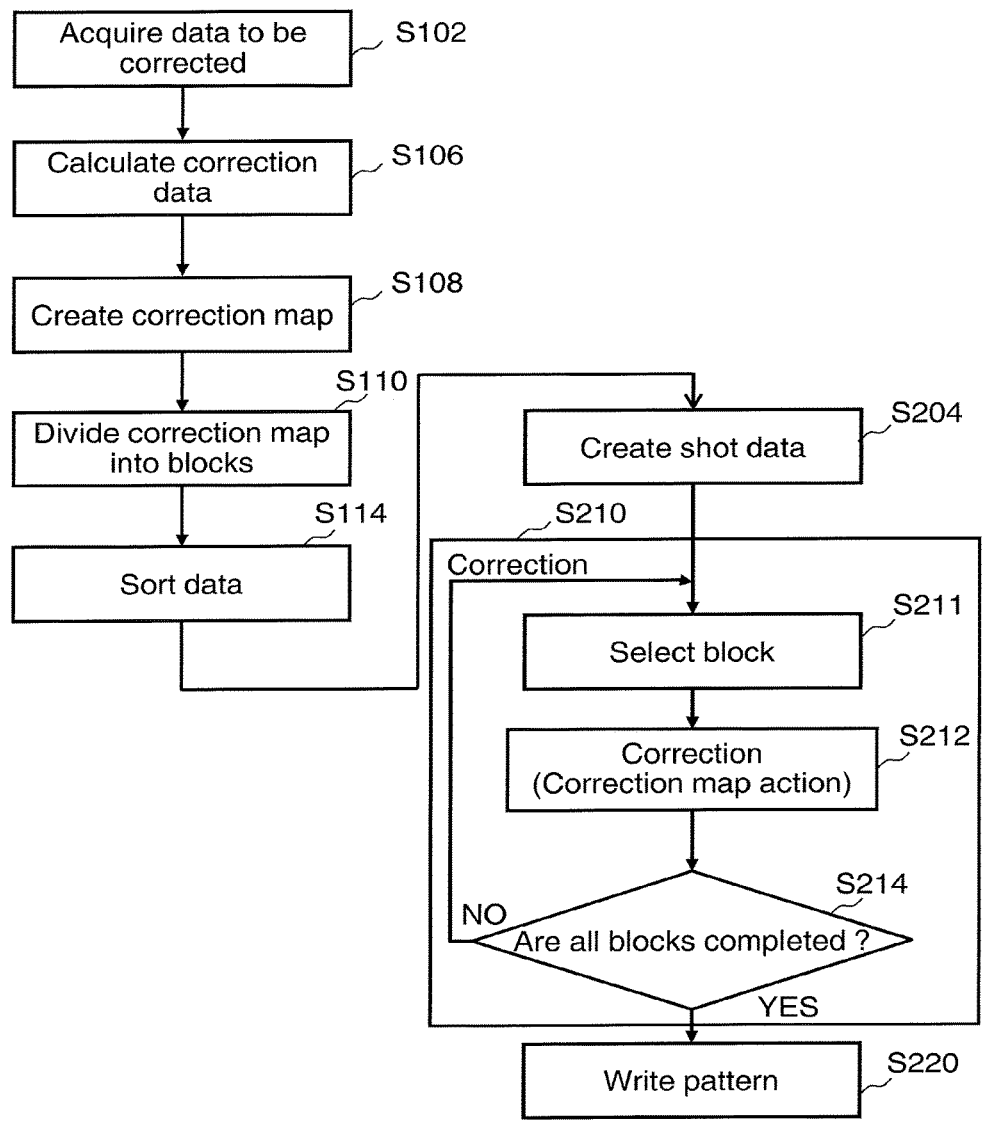
FIG. 8 is a flow chart showing principal processes of a pattern writing method according to Embodiment 1.

FIG. 8 is a flow chart showing principal processes of a pattern writing method according to Embodiment 1; In FIG. 8, a sequence of processes including a correction target data acquisition process (S102), a correction data calculation process (S106), a correction map creation process (S108), a block division process (S110), a data sorting process (S114), a shot data creation process (S204), a correction process (S210), and a pattern writing process (S220) is executed. In the correction process (S210), a sequence of processes including a block selection process (S211), a correction process (S212), and a determination process (S214) is executed as internal processes. Each process from the correction target data acquisition process (S102) to the data sorting process (S114) may be executed as pre-processing for performing pattern writing processing. Alternatively, each process from the correction target data acquisition process (S102) to the correction map creation process (S108) may be executed as pre-processing for performing pattern writing processing.

Before starting pattern writing processing, the quantity of positional displacement of beam for each pixel when the target object 101 surface is irradiated with the multiple beams 20 is measured in advance. Though not shown, irradiation positions may be measured by arranging a measurement substrate coated with a resist on the stage 105 and irradiating the substrate with the multiple beams 20. For example, the beam irradiation position of pixels on the measurement substrate may be measured using, for example, a position sensor after writing into one pixel at a time following a pattern writing sequence or a plurality of pixels that are separated from each other to the extent that measurements are not hindered. The quantity of positional displacement for each pixel is measured by determining a difference between the designed position and the measured position. By repeating such an operation, quantities of positional displacement of beam are measured for the numbers of beams n and m in the x and y directions or all pixels in the irradiation region 34. Positional displacement data obtained in this manner is input from outside and stored in the storage device 144. In Embodiment 1, as described above, pattern writing proceeds while moving the irradiation region 34 that can be irradiated with one shot of the multiple beams 20 as a whole. Thus, when a pattern is written into the stripe region 35, positional displacement arising in a pixel region 38 being each pixel corresponding region inside the irradiation region 34 is repeated. Therefore, if the quantity of positional displacement arising in each of the pixel regions 38 in the irradiation region 34 is known, the quantity of positional displacement in each position in the stripe region 35 can be known.

Thus, in Embodiment 1, the irradiation region 34 of about the size of (Px·n)×(Py·m), in other words, the size of the multiple beams 20 as a whole is set as a setting region 33 for correction map creation. However, the size of the setting region 33 is not limited to the above size. The setting region 33 may be set to a size that does not exceed double the size of the multiple beams 20 as a whole in the x and y directions. In other words, the setting region 33 may be set to a size that does not exceed 2(Px·n)×2(Py·m). The setting region 33 is divided into a plurality of pixels like a grid of, for example, one beam size (predetermined quantization dimension).

As the correction target data acquisition process (S102), the positional displacement data acquisition unit 50 reads positional displacement data stored in the storage device 144 and inputs (acquires) the quantity of positional displacement for each of the pixel regions 38 in the setting region 33.

As the correction data calculation process (S106), the correction data calculator 54 being the dose modulation value data calculator calculates, for each of a plurality of pixel regions 38 to be regions obtained by dividing the setting region 33 of a size that does not exceed double the size of the multiple beams 20 as a whole by a predetermined quantization dimension into a grid shape, a first dose modulation value of a beam to the target pixel that corrects, by modulating a dose, positional displacement of an irradiation pattern generated by positional displacement of a beam with which the target pixel is irradiated following a pattern writing sequence and a second dose modulation value to allocate a dose to at least one of surrounding pixels of the target pixel. The dose modulation value may be defined by using "ratio" or "percentage". The dose modulation value (amount) is preferable to be defined by ratio or by percentage.

Figure 9:
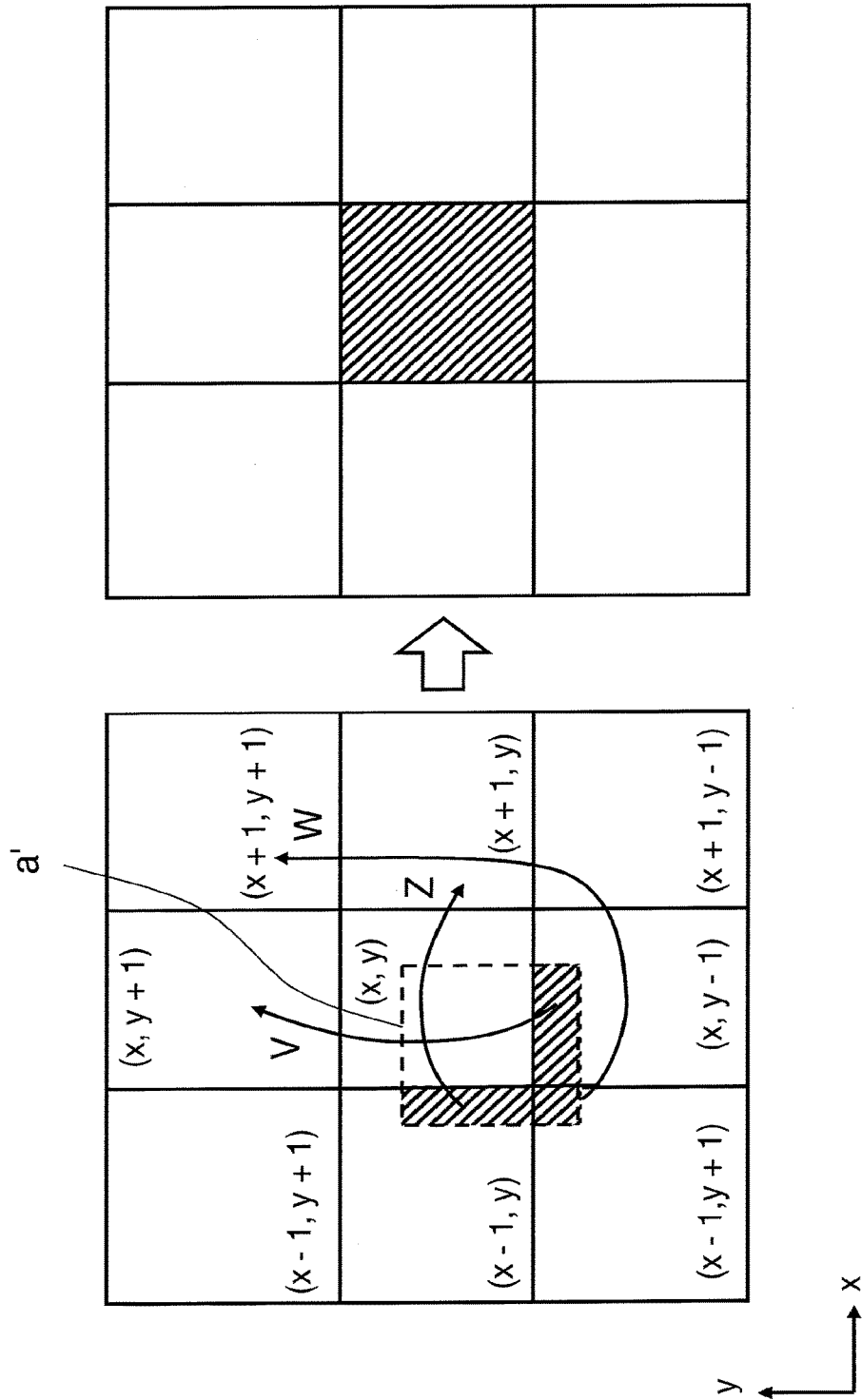
FIGS. 9A and 9B are diagrams illustrating an example of a positional displacement correcting method according to Embodiment 1.

FIGS. 9A and 9B are diagrams illustrating an example of a positional displacement correcting method according to Embodiment 1; In the example of FIG. 9A, a case when a beam a' with which the pixel of coordinates (x, y) is irradiated causes positional displacements to −x, −y sides. To correct the positional displacement of a pattern formed by the beam a' positionally displaced to a position matching the pixel of coordinates (x, y) as shown in FIG. 9B, the dose for the displacement is allocated to pixels on the opposite side of the direction in which surrounding pixels are displaced for correction. In the example of FIGS. 9A and 9B, the dose displaced to the pixel in coordinates (x, y−1) may be allocated to the pixel in coordinates (x, y+1). The dose displaced to the pixel in coordinates (x−1, y) may be allocated to the pixel in coordinates (x+1, y). The dose displaced to the pixel in coordinates (x−1, y−1) may be allocated to the pixel in coordinates (x+1, y+1).

In Embodiment 1, a second beam dose modulation value being an amount of allocation (allocation factor) for allocating a dose to at least one of surrounding beams for pixels in proportion to the quantity of positional displacement of a beam is operated. The correction data calculator 54 operates the dose modulation value of a beam to the target pixel and the dose modulation value of a beam to at least one of surrounding pixels of the target pixel in accordance with the ratio of displaced area caused by positional displacement of a beam to the target pixel. More specifically, the dose modulator operates a modulation value, with the ratio obtained by dividing the displaced area, i.e., an area of overlapped beam portions, by the beam area for each surrounding pixel where beams are partially overlapped, for example, as the amount of allocation to the pixel positioned on the opposite side of the overlapped pixel.

In the example of FIG. 9A, the area ratio displaced to the pixel in coordinates (x, y−1) can be operated as (x-direction beam size−(−x)-direction displacement)×y-direction displacement/(x-direction beam size×y-direction beam size). Thus, a modulation value V to be allocated to the pixel in coordinates (x, y−1) for correction can be operated as (x-direction beam size−x-direction displacement)×y-direction displacement/(x-direction beam size×y-direction beam size).

In the example of FIG. 9A, the area ratio displaced to the pixel in coordinates (x−1, y−1) can be operated as (−x)-direction displacement×(−y)-direction displacement/(x-direction beam size×y-direction beam size). Thus, a modulation value W to be allocated to the pixel in coordinates (x+1, y+1) for correction can be operated as (−x)-direction displacement×(−y)-direction displacement/(x-direction beam size×y-direction beam size).

In the example of FIG. 9A, the area ratio displaced to the pixel in coordinates (x−1, y) can be operated as (−x)-direction displacement×(y-direction beam size−(−y)-direction displacement)/(x-direction beam size×y-direction beam size). Thus, a modulation value Z to be allocated to the pixel in coordinates (x+1, y) for correction can be operated as (−x)-direction displacement×(y-direction beam size−(−y)-direction displacement)/(x-direction beam size×y-direction beam size).

As a result, the percentage of modulation U of a beam of the pixel in coordinates (x, y) remaining without being allocated can be operated as 1−V−W−Z.

In the manner described above, the dose modulation value of a beam to the target pixel and the dose modulation value of a beam to at least one of surrounding pixels as an allocation destination are operated for each pixel.

As the correction map creation process (S108), the correction map creator 55 (dose modulation map creator) creates a dose modulation map in which a modulation value group is defined for each of the pixels 36 of the setting region 33 such that, for each of the pixels 36, a modulation value U of a beam to the target pixel 36 calculated is defined in the position of the target pixel 36 and also a modulation value V (or/and a modulation value W, or/and a modulation value Z) to allocate a dose to at least one of surrounding pixels of the target pixel 36 is defined in the position of the allocation destination pixel by associating with the position of the target pixel 36.

Figure 10:
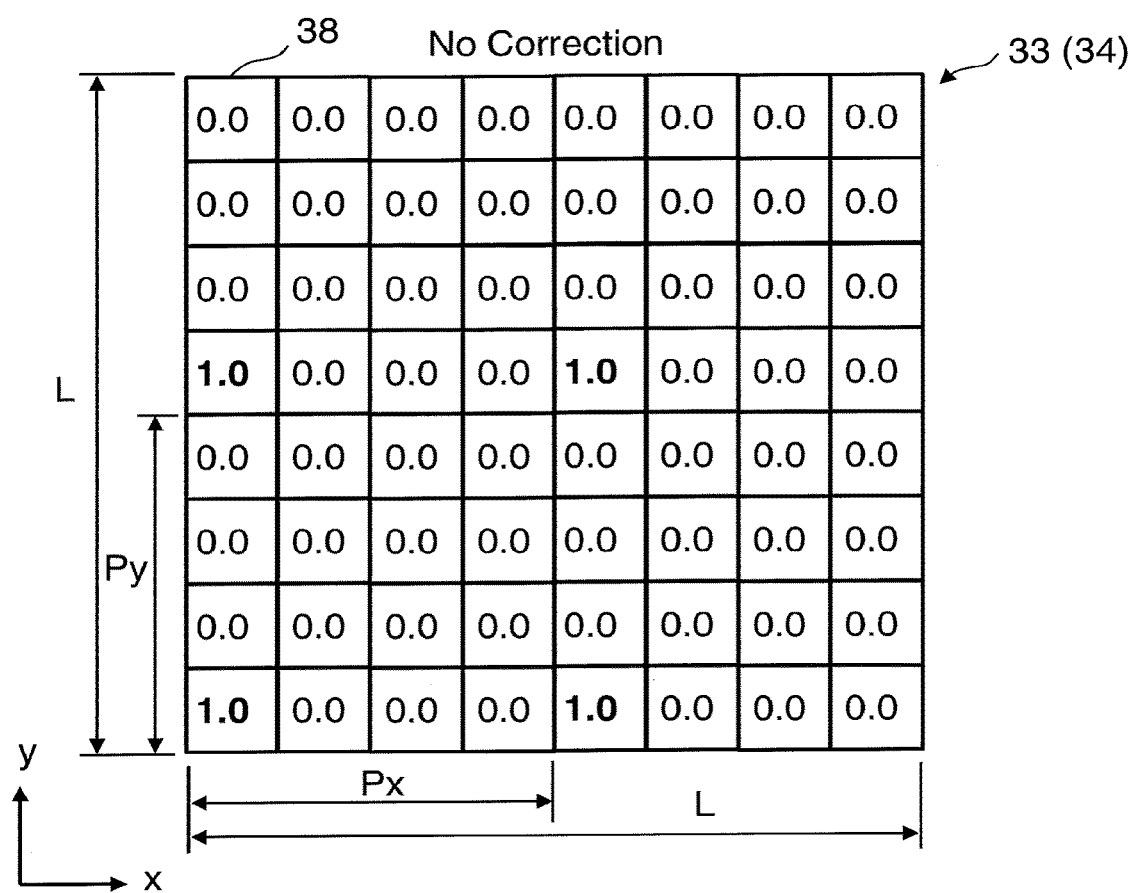
FIG. 10 is a diagram showing an example of a dose modulation map when the dose modulation value of each pixel in a setting region is defined without correction to be Comparative Example of Embodiment 1.

FIG. 10 is a diagram showing an example of a dose modulation map when the dose modulation value of each pixel in a setting region is defined without correction to be Comparative Example of Embodiment 1; In the example of FIG. 10, a case in which the setting region 33 has the same size as that of the irradiation region 34. Also, in the example of FIG. 10, like examples of FIGS. 6A to 6D and FIGS. 7A to 7D, a case in which a pattern is written by multiple beams of, for example, 2×2 to simplify the description. Then, a case in which beam pitches Px, Py between beams adjacent in the x, y directions of the multiple beams 20 are set to the size of four pixels respectively is shown. Thus, the setting region 33 which is to be the irradiation region 34 that can be irradiated with one shot of the multiple beams 20 as a whole is shown as a region of 8×8 pixels. Also in the example of FIG. 10, a pixel region 38 of the first row in the y direction and the first column in the x direction of the irradiation region 34, a pixel region 38 of the fifth row in the y direction and the first column in the x direction of the irradiation region 34, a pixel region 38 of the first row in the y direction and the fifth column in the x direction of the irradiation region 34, and a pixel region 38 of the fifth row in the y direction and the fifth column in the x direction of the irradiation region 34 to be the pixel regions 38 of, for example, the first shot of the multiple beams of 2×2 are focused on. If the dose resulting from positional displacement of a beam is not corrected, as shown in FIG. 10, the above pixel regions have all "1". In the example of FIG. 10, the four pixel regions 38 are focused on and "0" is defined for the other pixel regions 38 and it is needless to say that the dose modulation value of all the other pixel regions 38 is "1" if the dose resulting from positional displacement of a beam is not corrected.

FIG. 11 is a diagram showing an example of the dose modulation value with correction focusing on the pixel region 38 of the first shot of multiple beams in Embodiment 1 and the dose modulation value when allocated to surrounding pixel regions 38. In FIG. 11, the pixel region 38 of the first row in the y direction and the first column in the x direction of the irradiation region 34, the pixel region 38 of the fifth row in the y direction and the first column in the x direction of the irradiation region 34, the pixel region 38 of the first row in the y direction and the fifth column in the x direction of the irradiation region 34, and the pixel region 38 of the fifth row in the y direction and the fifth column in the x direction of the irradiation region 34 to be the pixel regions 38 of, for example, the first shot of the multiple beams of 2×2 are focused on.

If the beam of the focused pixel region 38 of the first row in the y direction and the first column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 11, a surrounding pixel region 38 of the first row in the y direction and the second column in the x direction, a surrounding pixel region 38 of the second row in the y direction and the first column in the x direction, and a surrounding pixel region 38 of the second row in the y direction and the second column in the x direction. In the example of FIG. 11, for example, the dose modulation value to be allocated to the surrounding pixel region 38 of the first row in the y direction and the second column in the x direction is 0.15, the dose modulation value to be allocated to the surrounding pixel region 38 of the second row in the y direction and the first column in the x direction is 0.14, and the dose modulation value to be allocated to the surrounding pixel region 38 of the second row in the y direction and the second column in the x direction is 0.07. Thus, the dose modulation value of the surrounding pixel region 38 of the first row in the y direction and the first column in the x direction of the irradiation region 34 becomes 0.64.

If the beam of the focused pixel region 38 of the fifth row in the y direction and the first column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 11, a surrounding pixel region 38 of the fifth row in the y direction and the second column in the x direction, a surrounding pixel region 38 of the sixth row in the y direction and the first column in the x direction, and a surrounding pixel region 38 of the sixth row in the y direction and the second column in the x direction. In the example of FIG. 11, for example, the dose modulation value to be allocated to the surrounding pixel region 38 of the fifth row in the y direction and the second column in the x direction is 0.15, the dose modulation value to be allocated to the surrounding pixel region 38 of the sixth row in the y direction and the first column in the x direction is 0.20, and the dose modulation value to be allocated to the surrounding pixel region 38 of the sixth row in the y direction and the second column in the x direction is 0.05. Thus, the dose modulation value of the focused pixel region 38 of the fifth row in the y direction and the first column in the x direction of the irradiation region 34 becomes 0.60.

If the beam of the focused pixel region 38 of the first row in the y direction and the fifth column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 11, a surrounding pixel region 38 of the first row in the y direction and the sixth column in the x direction, a surrounding pixel region 38 of the second row in the y direction and the fifth column in the x direction, and a surrounding pixel region 38 of the second row in the y direction and the sixth column in the x direction. In the example of FIG. 11, for example, the dose modulation value to be allocated to the surrounding pixel region 38 of the first row in the y direction and the sixth column in the x direction is 0.10, the dose modulation value to be allocated to the surrounding pixel region 38 of the second row in the y direction and the fifth column in the x direction is 0.10, and the dose modulation value to be allocated to the surrounding pixel region 38 of the second row in the y direction and the sixth column in the x direction is 0.10. Thus, the dose modulation value of the focused pixel region 38 of the first row in the y direction and the fifth column in the x direction of the irradiation region 34 becomes 0.70.

If the beam of the focused pixel region 38 of the fifth row in the y direction and the fifth column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 11, a surrounding pixel region 38 of the fifth row in the y direction and the sixth column in the x direction, a surrounding pixel region 38 of the sixth row in the y direction and the fifth column in the x direction, and a surrounding pixel region 38 of the sixth row in the y direction and the sixth column in the x direction. In the example of FIG. 11, for example, the dose modulation value to be allocated to the surrounding pixel region 38 of the fifth row in the y direction and the sixth column in the x direction is 0.10, the dose modulation value to be allocated to the surrounding pixel region 38 of the sixth row in the y direction and the fifth column in the x direction is 0.20, and the dose modulation value of a beam to be an amount of allocation (allocation factor) to the surrounding pixel region 38 of the sixth row in the y direction and the sixth column in the x direction is 0.05. Thus, the dose modulation value of a beam of the focused pixel region 38 of the fifth row in the y direction and the fifth column in the x direction of the irradiation region 34 becomes 0.65.

FIG. 12 is a diagram showing an example of the dose modulation value with correction focusing on the pixel region 38 of the second shot of multiple beams in Embodiment 1 and the dose modulation value when allocated to surrounding pixel regions 38. In FIG. 12, the pixel region 38 of the second row in the y direction and the first column in the x direction of the irradiation region 34, the pixel region 38 of the sixth row in the y direction and the first column in the x direction of the irradiation region 34, the pixel region 38 of the second row in the y direction and the fifth column in the x direction of the irradiation region 34, and the pixel region 38 of the sixth row in the y direction and the fifth column in the x direction of the irradiation region 34 to be the pixel regions 38 of, for example, the second shot of the multiple beams of 2×2 are focused on.

If the beam of the focused pixel region 38 of the second row in the y direction and the first column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 12, a surrounding pixel region 38 of the second row in the y direction and the second column in the x direction, a surrounding pixel region 38 of the third row in the y direction and the first column in the x direction, and a surrounding pixel region 38 of the third row in the y direction and the second column in the x direction. In the example of FIG. 12, for example, the dose modulation value to be allocated to the surrounding pixel region 38 of the second row in the y direction and the second column in the x direction is 0.15, the dose modulation value to be allocated to the surrounding pixel region 38 of the third row in the y direction and the first column in the x direction is 0.14, and the dose modulation value to be allocated to the surrounding pixel region 38 of the third row in the y direction and the second column in the x direction is 0.07. Thus, the dose modulation value of the focused pixel region 38 of the second row in the y direction and the first column in the x direction of the irradiation region 34 becomes 0.64.

If the beam of the focused pixel region 38 of the sixth row in the y direction and the first column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 12, a surrounding pixel region 38 of the sixth row in the y direction and the second column in the x direction, a surrounding pixel region 38 of the seventh row in the y direction and the first column in the x direction, and a surrounding pixel region 38 of the seventh row in the y direction and the second column in the x direction. In the example of FIG. 12, for example, the dose modulation value to be allocated to the surrounding pixel region 38 of the sixth row in the y direction and the second column in the x direction is 0.15, the dose modulation value to be allocated to the surrounding pixel region 38 of the seventh row in the y direction and the first column in the x direction is 0.20, and the dose modulation value to be allocated to the surrounding pixel region 38 of the seventh row in the y direction and the second column in the x direction is 0.05. Thus, the dose modulation value of the focused pixel region 38 of the sixth row in the y direction and the first column in the x direction of the irradiation region 34 becomes 0.60.

If the beam of the focused pixel region 38 of the second row in the y direction and the fifth column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 12, a surrounding pixel region 38 of the second row in the y direction and the sixth column in the x direction, a surrounding pixel region 38 of the third row in the y direction and the fifth column in the x direction, and a surrounding pixel region 38 of the third row in the y direction and the sixth column in the x direction. In the example of FIG. 12, for example, the dose modulation value to be allocated to the surrounding pixel region 38 of the second row in the y direction and the sixth column in the x direction is 0.10, the dose modulation value to be allocated to the surrounding pixel region 38 of the third row in the y direction and the fifth column in the x direction is 0.10, and the dose modulation value to be allocated to the surrounding pixel region 38 of the third row in the y direction and the sixth column in the x direction is 0.10. Thus, the dose modulation value of the focused pixel region 38 of the first row in the y direction and the fifth column in the x direction of the irradiation region 34 becomes 0.70.

If the beam of the focused pixel region 38 of the sixth row in the y direction and the fifth column in the x direction of the irradiation region 34 is positionally displaced, for example, in the −x and −y directions within the range of the beam size, in Embodiment 1, like the description with reference to FIG. 9A, the beam dose of the focused pixel region 38 is allocated to, as shown in FIG. 12, a surrounding pixel region 38 of the sixth row in the y direction and the sixth column in the x direction, a surrounding pixel region 38 of the seventh row in the y direction and the fifth column in the x direction, and a surrounding pixel region 38 of the seventh row in the y direction and the sixth column in the x direction. In the example of FIG. 12, for example, the dose modulation value to be allocated to the surrounding pixel region 38 of the sixth row in the y direction and the sixth column in the x direction is 0.10, the dose modulation value to be allocated to the surrounding pixel region 38 of the seventh row in the y direction and the fifth column in the x direction is 0.20, and the dose modulation value to be allocated to the surrounding pixel region 38 of the seventh row in the y direction and the sixth column in the x direction is 0.05. Thus, the dose modulation value of the focused pixel region 38 of the fifth row in the y direction and the fifth column in the x direction of the irradiation region 34 becomes 0.65.

In the example of FIG. 12, the deflection amount of collective deflection of the multiple beams 20 from the first shot to the second shot by the sub-deflector 209 is small and thus, an amount of allocation (dose modulation value of a beam) similar to that in the example of FIG. 11 is shown, but the present embodiment is not limited to such an example. The quantity and direction of positional displacement may be different from the pixel region 38 to the pixel region 38 due to influences such as deflection dependence. In such a case, beams passing through the same hole of the shaping aperture plate array substrate may have an amount of allocation (dose modulation value of a beam) to surrounding pixel regions 38 that is different from that of other pixel regions 38.

Figure 13:
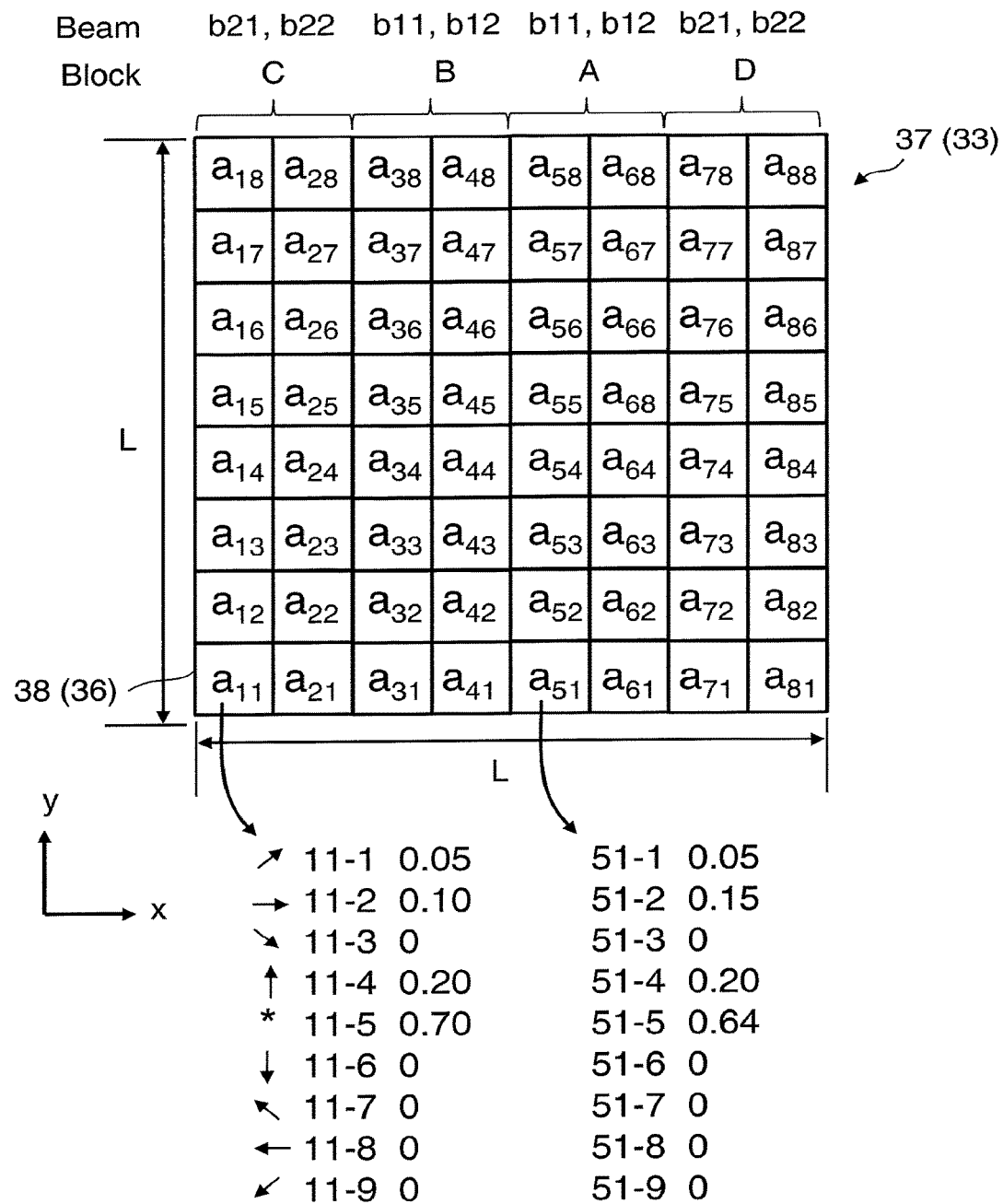
FIG. 13 is a diagram showing an example of a correction map in Embodiment 1.

FIG. 13 is a diagram showing an example of a correction map in Embodiment 1; In a correction map 37 being a dose modulation map in FIG. 13, the dose modulation value of the target pixel region 38 and the dose modulation value allocated from its surroundings are defined as a sequence of data aij for each of the pixel regions 38 inside the setting region 33. i and j are each indexes indicating the position of the pixel region 38. A sequence of data aij defined for the pixel region 38 in coordinates (i, j) is defined in the order of, for example, a dose modulation value of a pixel region 38 at the lower left (i−1, j−1) of the target pixel region 38 as ij−1 data, a dose modulation value of a pixel region 38 on the left (i−1, j) of the target pixel region 38 as ij−2 data, a dose modulation value of a pixel region 38 at the upper left (i−1, j+1) of the target pixel region 38 as ij−3 data, a dose modulation value of a pixel region 38 below (i, j−1) the target pixel region 38 as ij−4 data, a dose modulation value being a remaining amount of allocation of the target pixel region 38 as ij−5 data, a dose modulation value of a pixel region 38 above (i+1, j) the target pixel region 38 as ij−6 data, a dose modulation value of a pixel region 38 at the lower right (i+1, j−1) of the target pixel region 38 as ij−7 data, an amount of allocation (dose modulation value) of a pixel region 38 on the right (i+1, j) of the target pixel region 38 as ij−8 data, and an amount of allocation (dose modulation value) from a pixel region 38 at the upper right (i+1, j+1) of the target pixel region 38 as ij−9 data. As has been described with reference to FIGS. 6B to 7D, a pixel 36 group in the first and second columns in the x direction is irradiated with the beams b21 and b22 in the 1SF. When a pattern is written into the stripe region 35, the arrangement of the same beams is repeated in the cycle from the first to eighth columns in the x direction. If the stripe below the stripe region 35 has the same beam arrangement as the stripe region 35, the beam allocating a dose from the lower left to the pixel region 38 in coordinates (1, 1) is the beam b22, the beam allocating a dose from the left is the beam b21, the beam allocating a dose from the upper left is the beam b21, the beam allocating a dose from below is the beam b22, the beam of the target pixel is the beam b21, the beam allocating a dose from above is the beam b21, the beam allocating a dose from the lower right is the beam b22, the beam allocating a dose from the right is the beam b21, and the beam allocating a dose from the upper right is the beam b21. Therefore, 0.05, 0.10, 0, 0.20, 0.70, 0, 0, 0, 0 is defined as a sequence of data all defined for the pixel region 38 in coordinates (1, 1) in the example of FIG. 13. 0.05, 0.15, 0, 0.2, 0.64, 0, 0, 0, 0 will be defined as a sequence of data a51 defined for the pixel region 38 in coordinates (5, 1) in the example of FIG. 13. In this manner described above, data aij of each of the pixel regions 38 determines in advance the order of defining the dose modulation value for the local pixel region 38 and eight pixel regions 38 surrounding the local pixel region 38. Accordingly, it can be determined whether the amount of allocation (dose modulation value) comes from which pixel region 38 or the local pixel region 38 based on the position of the data. The created correction map 37 is stored in the memory 112.

An incident dose D before positional displacement corrections does not take positional displacement of beams into consideration. Thus, it is necessary to operate a corrected incident dose D' for each of the pixels 36 using the correction map 37. In the correction map 37, as described above, the dose modulation value of the target pixel region 38 and the dose modulation value allocated from its surroundings are defined as a sequence of data aij for each of the pixel regions 38 inside the setting region 33 and thus, the amount of data thereof is larger than that of incident dose data. As described above, a lithography apparatus performs data processing and an actual pattern writing operation in real time like performing data processing for each fixed region called the stripe region 35 and performing a pattern writing operation of the stripe region 35 for which processing is completed. Thus, when the dose of each irradiation position is operated, it takes a considerable time for the arithmetic processor 67 only to read data of such a dose modulation map from the main memory 112 and a problem that memory bands of the main memory 112 cannot catch up with an operating speed of dose arises. Therefore, a problem that a data processing speed slows and in turn, throughput of pattern writing processing deteriorates arises. In Embodiment 1, the range of the correction map (dose modulation map) is reduced to the setting region 33 corresponding to the irradiation region 34 of the multiple beams 20 or the like, but even so, memory bands of the main memory 112 may not be able to catch up with an operating speed of the dose. Thus, in Embodiment 1, the incident dose is operated efficiently by further dividing the setting region 33 into a plurality of blocks to make the amount of data smaller.

As the block division process (S110), the divider 62 being a block divider divides the correction map 37 into a plurality of blocks for each preset number of pixels. In Embodiment 1, the correction map is divided into a plurality of blocks, with a y-direction column of two pixel regions in the x direction being set as a block. In Embodiment 1, a y-direction column for two pixel regions in the first and second columns in the x direction irradiated with the beams b11 and b12 of the irradiation region 34 is set as an A block, a y-direction column for two pixel regions in the third and fourth columns in the x direction irradiated with the beams b11 and b12 of the irradiation region 34 is set as a B block, a y-direction column for two pixel regions in the fifth and sixth columns in the x direction irradiated with the beams b21 and b22 of the irradiation region 34 is set as a C block, and a y-direction column for two pixel regions in the seventh and eighth columns in the x direction irradiated with the beams b21 and b22 of the irradiation region 34 is set as a D block. When a pattern is actually written into the stripe region 35 as described above, the arrangement of the same beams is repeated in the cycle from the first to eighth pixel columns in the x direction. Then, a pixel 36 group in the first and second columns in the x direction is irradiated with the beams b21 and b22 in the 1SF. Thus, the correction map may be created following the repeating cycle of arrangement of beams with which the pixel 36 is actually irradiated. In the example of FIG. 13, therefore, a case in which the correction map is created in the order of blocks C, B, A, and D is shown. More specifically, in the example of FIG. 13, a partial correction map (partial dose modulation map) of a pixel region group arranged in the y direction of the first and second columns in the x direction of the correction map 37 is created as the block C. A partial correction map of a pixel region group arranged in the y direction of the third and fourth columns in the x direction of the correction map 37 is created as the block B. A partial correction map (partial dose modulation map) of a pixel region group arranged in the y direction of the fifth and sixth columns in the x direction of the correction map 37 is created as the block A. A partial correction map of a pixel region group arranged in the y direction of the seventh and eighth columns in the x direction of the correction map 37 is created as the block D. In the example of FIG. 13, the correction map is divided into units of two columns in the x direction, but the present embodiment is not limited to such an example. The correction map may be divided into units of one column or three columns or more. In Embodiment 1, the correction map 37 is divided into a plurality of blocks in the number of pixels of a data size that can be held in the cache memory 70.

Figure 14:
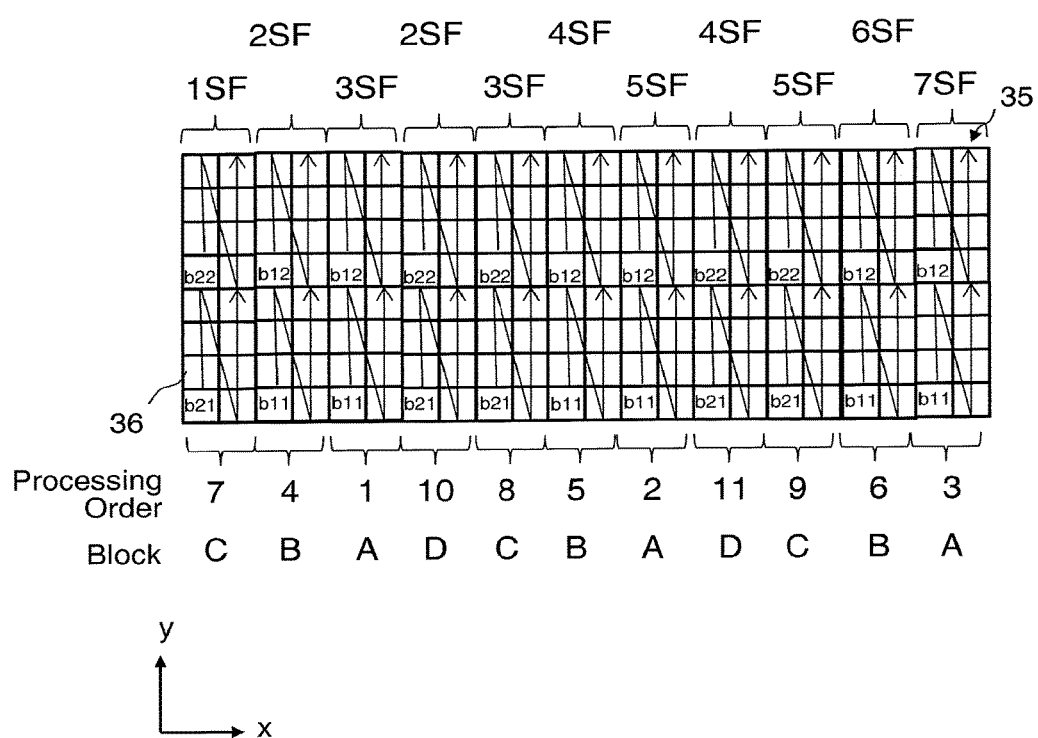
FIG. 14 is a diagram showing an example of the pattern writing order of stripe regions and an operation processing order of target blocks and incident doses in Embodiment 1.

FIG. 14 is a diagram showing an example of the pattern writing order of stripe regions and an operation processing order of target blocks and incident doses in Embodiment 1; When the stripe region 35 is divided into a plurality of the pixels 36, as has been described with reference to FIGS. 6B to 7D, a pixel 36 group in the first and second columns in the x direction is irradiated with the beams b21 and b22 in the 1SF. Thus, to operate the incident dose D' with which the pixel 36 group of the first and second columns in the x direction is irradiated, the partial correction map of the block corresponding to a pixel region 38 group irradiated with the beams b21 and b22 inside the setting region 33 is needed. In the example of FIG. 13 in which the setting region 33 and the irradiation region 34 are set to the same size, the partial correction map of the block C applies.

A pixel 36 group of the third and fourth columns in the x direction of the stripe region 35 is irradiated with the beams b11 and b12 in the 2SF. Thus, to operate the incident dose D' with which the pixel 36 group of the third and fourth columns in the x direction is irradiated, the partial correction map of the block corresponding to a pixel region 38 group irradiated with the beams b11 and b12 inside the setting region 33 is needed. In the example of FIG. 13, the partial correction map of the block B applies.

A pixel 36 group of the fifth and sixth columns in the x direction of the stripe region 35 is irradiated with the beams b11 and b12 in the 3SF. Thus, to operate the incident dose D' with which the pixel 36 group of the fifth and sixth columns in the x direction is irradiated, the partial correction map of the block corresponding to a pixel region 38 group irradiated with the beams b11 and b12 inside the setting region 33 is needed. In the example of FIG. 13, the partial correction map of the block A applies.

A pixel 36 group of the seventh and eighth columns in the x direction of the stripe region 35 is irradiated with the beams b21 and b22 in the 2SF. Thus, to operate the incident dose D' with which the pixel 36 group of the seventh and eighth columns in the x direction is irradiated, the partial correction map of the block corresponding to a pixel region 38 group irradiated with the beams b21 and b22 inside the setting region 33 is needed. In the example of FIG. 13, the partial correction map of the block D applies.

A pixel 36 group of the ninth and tenth columns in the x direction of the stripe region 35 is irradiated with the beams b21 and b22 in the 3SF. Thus, to operate the incident dose D' with which the pixel 36 group of the ninth and tenth columns in the x direction is irradiated, the partial correction map of the block corresponding to a pixel region 38 group irradiated with the beams b21 and b22 inside the setting region 33 is needed. In the example of FIG. 13, the partial correction map of the block C applies.

A pixel 36 group of the eleventh and twelfth columns in the x direction of the stripe region 35 is irradiated with the beams b11 and b12 in the 4SF. Thus, to operate the incident dose D' with which the pixel 36 group of the eleventh and twelfth columns in the x direction is irradiated, the partial correction map of the block corresponding to a pixel region 38 group irradiated with the beams b11 and b12 inside the setting region 33 is needed. In the example of FIG. 13, the partial correction map of the block B applies.

A pixel 36 group of the thirteenth and fourteenth columns in the x direction of the stripe region 35 is irradiated with the beams b11 and b12 in the 5SF. Thus, to operate the incident dose D' with which the pixel 36 group of the thirteenth and fourteenth columns in the x direction is irradiated, the partial correction map of the block corresponding to a pixel region 38 group irradiated with the beams b11 and b12 inside the setting region 33 is needed. In the example of FIG. 13, the partial correction map of the block A applies.

A pixel 36 group of the fifteenth and sixteenth columns in the x direction of the stripe region 35 is irradiated with the beams b21 and b22 in the 4SF. Thus, to operate the incident dose D' with which the pixel 36 group of the fifteenth and sixteenth columns in the x direction is irradiated, the partial correction map of the block corresponding to a pixel region 38 group irradiated with the beams b21 and b22 inside the setting region 33 is needed. In the example of FIG. 13, the partial correction map of the block D applies.

A pixel 36 group of the seventeenth and eighteenth columns in the x direction of the stripe region 35 is irradiated with the beams b21 and b22 in the 5SF. Thus, to operate the incident dose D' with which the pixel 36 group of the seventeenth and eighteenth columns in the x direction is irradiated, the partial correction map of the block corresponding to a pixel region 38 group irradiated with the beams b21 and b22 inside the setting region 33 is needed. In the example of FIG. 13, the partial correction map of the block C applies.

A pixel 36 group of the nineteenth and twentieth columns in the x direction of the stripe region 35 is irradiated with the beams b11 and b12 in the 6SF. Thus, to operate the incident dose D' with which the pixel 36 group of the eleventh and twelfth columns in the x direction is irradiated, the partial correction map of the block corresponding to a pixel region 38 group irradiated with the beams b11 and b12 inside the setting region 33 is needed. In the example of FIG. 13, the partial correction map of the block B applies.

A pixel 36 group of the twenty-first and twenty-second columns in the x direction of the stripe region 35 is irradiated with the beams b11 and b12 in the 7SF. Thus, to operate the incident dose D' with which the pixel 36 group of the twenty-first and twenty-second columns in the x direction is irradiated, the partial correction map of the block corresponding to a pixel region 38 group irradiated with the beams b11 and b12 inside the setting region 33 is needed. In the example of FIG. 13, the partial correction map of the block A applies.

In the example of FIG. 14, as described above, positional displacements of the pixel region 38 groups of blocks in charge arise in the order of the blocks C, B, A, and D in the stripe region 35. Then, such positional displacements of the pixel region 38 groups of blocks in charge in the order of the blocks C, B, A, and D are repeated.

Thus, in Embodiment 1, when data of a dose modulation value groups of the partial correction map of one of a plurality of blocks is once held in the cache memory 70, the data of the dose modulation value groups of the same block is continuously used repeatedly without switching to data of the dose modulation value groups of another block to operate the incident dose D' after corrections of beams into each of target pixels 36 inside the stripe region 35. Thus, in the example of FIG. 14, the operation of the incident dose D' of the pixel 36 group of the fifth and sixth columns in the x direction in which the partial correction map of the block A of the stripe region 35 is needed is set to No. 1 of the processing order. Next, the operation of the incident dose D' of the pixel 36 group of the thirteenth and fourteenth columns in the x direction in which the partial correction map of the block A is needed is set to No. 2 of the processing order. Next, the operation of the incident dose D' of the pixel 36 group of the twenty-first and twenty-second columns in the x direction in which the partial correction map of the block A is needed is set to No. 3 of the processing order.

Next, the operation of the incident dose D' of the pixel 36 group of the third and fourth columns in the x direction in which the partial correction map of the block B of the stripe region 35 is needed is set to No. 4 of the processing order. Next, the operation of the incident dose D' of the pixel 36 group of the eleventh and twelfth columns in the x direction in which the partial correction map of the block B is needed is set to No. 5 of the processing order. Next, the operation of the incident dose D' of the pixel 36 group of the nineteenth and twentieth columns in the x direction in which the partial correction map of the block B is needed is set to No. 6 of the processing order.

Next, the operation of the incident dose D' of the pixel 36 group of the first and second columns in the x direction in which the partial correction map of the block C of the stripe region 35 is needed is set to No. 7 of the processing order. Next, the operation of the incident dose D' of the pixel 36 group of the ninth and tenth columns in the x direction in which the partial correction map of the block C is needed is set to No. 8 of the processing order. Next, the operation of the incident dose D' of the pixel 36 group of the seventeenth and eighteenth columns in the x direction in which the partial correction map of the block C is needed is set to No. 9 of the processing order.

Next, the operation of the incident dose D' of the pixel 36 group of the seventh and eighth columns in the x direction in which the partial correction map of the block D of the stripe region 35 is needed is set to No. 10 of the processing order. Next, the operation of the incident dose D' of the pixel 36 group of the fifteenth and sixteenth columns in the x direction in which the partial correction map of the block D is needed is set to No. 11 of the processing order. Hereinafter, processing proceeds according to the order as described above.

As the data sorting process (S114), the converter 64 being an arrangement order changer sorts data of the dose modulation value groups defined for a plurality of pixel regions of a block in each allocation direction.

Figures 15A, 15B:
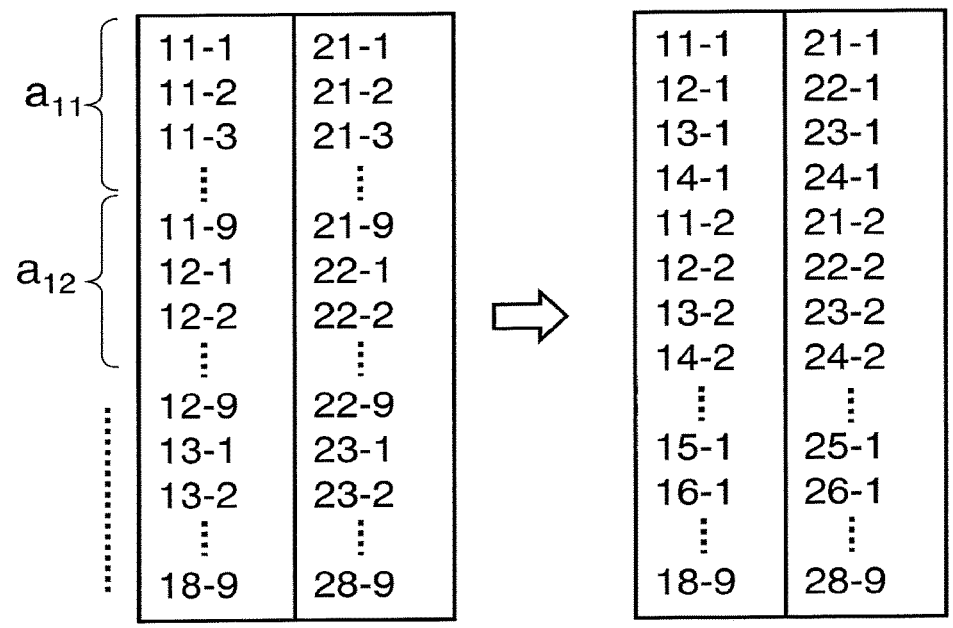
FIGS. 15A and 15B are diagrams illustrating an example of data sorting of a partial correction map according to Embodiment 1.

FIGS. 15A and 15B are diagrams illustrating an example of data sorting of a partial correction map according to Embodiment 1; As shown in FIG. 15A, data of the dose modulation value groups of a partial correction map before data sorting has pixel region groups arranged in the y direction of the first and second columns in the x direction of the block C defined in the order of pixel regions. In the example of FIG. 15A, a sequence of data all defined for the pixel region 38 in coordinates (1, 1), a sequence of data a12 defined for the pixel region 38 in coordinates (1, 2), . . . , and a sequence of data a18 defined for the pixel region 38 in coordinates (1, 8) are defined in the above order for the first column in the x direction of the partial correction map of the block C. A sequence of data a21 defined for the pixel region 38 in coordinates (2, 1), a sequence of data a22 defined for the pixel region 38 in coordinates (2, 2), . . . , and a sequence of data a28 defined for the pixel region 38 in coordinates (2, 8) are defined in the above order for the second column in the x direction of the partial correction map of the block C. Then, for a sequence of data aij, as described above, ij-1 data to ij-9 data are successively defined.

In Embodiment 1, for such a partial correction map, ij-k data (k is an identifier that shows the position and allocation direction of the local pixel region and is, for example, an integer from 1 to 9) is sorted for each k. In other words, regarding each column in the x direction, only the dose modulation value from, for example, the pixel region 38 at the lower left of each of the pixel regions 38 is successively arranged. Next, only the dose modulation value from, for example, the pixel region 38 on the left of each of the pixel regions 38 is successively arranged. Next, only the dose modulation value from, for example, the pixel region 38 at the upper left of each of the pixel regions 38 is successively arranged. Next, only the dose modulation value from, for example, the pixel region 38 below each of the pixel regions 38 is successively arranged. Next, only the dose modulation value of the residue of allocation of each of the local pixel regions 38 is successively arranged. Next, only the dose modulation value from, for example, the pixel region 38 above each of the pixel regions 38 is successively arranged. Next, only the dose modulation value from, for example, the pixel region 38 at the lower right of each of the pixel regions 38 is successively arranged. Next, only the dose modulation value from, for example, the pixel region 38 on the right of each of the pixel regions 38 is successively arranged. Next, only the dose modulation value from, for example, the pixel region 38 at the upper right of each of the pixel regions 38 is successively arranged.

In the example of FIG. 15B, by sorting data, 11-1 data defined for the pixel region 38 in coordinates (1, 1), 12-1 data defined for the pixel region 38 in coordinates (1, 2), . . . , and 14-1 data defined for the pixel region 38 in coordinates (1, 4) are defined in the above order, next 11-2 data defined for the pixel region 38 in coordinates (1, 1), 12-2 data defined for the pixel region 38 in coordinates (1, 2), . . . , and 14-2 data defined for the pixel region 38 in coordinates (1, 4) are defined in the above order, . . . , 11-9 data defined for the pixel region 38 in coordinates (1, 1), 12-9 data defined for the pixel region 38 in coordinates (1, 2), . . . , and 14-9 data defined for the pixel region 38 in coordinates (1, 4) are defined in the above order, next 15-1 data defined for the pixel region 38 in coordinates (1, 5), 16-1 data defined for the pixel region 38 in coordinates (1, 6), . . . , and 18-1 data defined for the pixel region 38 in coordinates (1, 8) are defined in the above order, next 15-2 data defined for the pixel region 38 in coordinates (1, 5), 16-2 data defined for the pixel region 38 in coordinates (1, 6), . . . , and 18-2 data defined for the pixel region 38 in coordinates (1, 8) are defined in the above order, . . . , and 15-9 data defined for the pixel region 38 in coordinates (1, 5), 16-9 data defined for the pixel region 38 in coordinates (1, 6), . . . , and 18-9 data defined for the pixel region 38 in coordinates (1, 8) are defined in the above order as a data group of the first column in the x direction of the partial correction map of the block C.

Similarly, by sorting data, 21-1 data defined for the pixel region 38 in coordinates (2, 1), 22-1 data defined for the pixel region 38 in coordinates (2, 2), . . . , and 24-1 data defined for the pixel region 38 in coordinates (2, 4) are defined in the above order, next 21-2 data defined for the pixel region 38 in coordinates (2, 1), 22-2 data defined for the pixel region 38 in coordinates (2, 2), . . . , and 28-2 data defined for the pixel region 38 in coordinates (2, 4) are defined in the above order, . . . , 21-9 data defined for the pixel region 38 in coordinates (2, 1), 22-9 data defined for the pixel region 38 in coordinates (2, 2), . . . , and 24-9 data defined for the pixel region 38 in coordinates (2, 4) are defined in the above order, next 25-1 data defined for the pixel region 38 in coordinates (2, 5), 26-1 data defined for the pixel region 38 in coordinates (2, 6), . . . , and 28-1 data defined for the pixel region 38 in coordinates (2, 8) are defined in the above order, next 25-2 data defined for the pixel region 38 in coordinates (2, 5), 26-2 data defined for the pixel region 38 in coordinates (2, 6), . . . , and 28-2 data defined for the pixel region 38 in coordinates (2, 8) are defined in the above order, . . . , and 25-9 data defined for the pixel region 38 in coordinates (2, 5), 26-9 data defined for the pixel region 38 in coordinates (2, 6), . . . , and 28-9 data defined for the pixel region 38 in coordinates (2, 8) are defined in the above order as a data group of the second column in the x direction of the partial correction map of the block C. Similarly, data of the blocks B, A, and D is sorted. The correction map in which data of all blocks C, B, A, and D is sorted is stored in the memory 112. After creating the correction map as pre-processing, the actual pattern writing processing is started.

First, a pattern writing region of the target object 101 or a chip region into which a pattern is written is divided into stripe regions on a thin rectangle of a predetermined width by the shot data creator 57 or the data processor 61. Then, each stripe region is virtually divided into a plurality of the above pixels (mesh region).

As the shot data creation process (S204), the shot data creator 57 reads pattern writing data (figure data) from the storage device 140 and calculates a pattern area density arranged inside each pixel or each of a plurality of pixels. For example, corresponding pattern writing data is read from the storage device 140 for each stripe region. For example, the shot data creator 57 assigns a plurality of figure patterns defined in the pattern writing data to corresponding pixels. Then, the shot data creator 57 may calculate the figure pattern area density arranged for each pixel or each of the plurality of pixels.

Also, the shot data creator 57 (dose operation unit) operates the incident dose D of a beam into each of the pixels 36 inside the stripe region 35. Here, the incident dose (or a beam irradiation time T: also called a shot time or an exposure time and this also applies below) of an electron beam per shot for each of the pixels 36 is calculated. When multiple pattern writing is performed, the incident dose of an electron beam per shot in each layer may be calculated. The incident dose to be a reference is suitably determined in proportion to the calculated pattern area density. Also, the dose calculated finally in the shot data creation process (S204) is suitably a corrected incident dose in which dimensional variations caused by a phenomenon causing dimensional variations such as the proximity effect, fogging effects, and loading effects (not shown) are corrected based on the dose. A plurality of pixels defining the incident dose and a plurality of mesh regions defining the pattern area density may have the same size or different sizes. When constituted to have different sizes, each incident dose may be determined after interpolating the area density using linear interpolation or the like. The beam irradiation time can be defined by a value obtained by dividing the incident dose D by a current density J. If the current density J of each beam varies, a dose modulation value relating to variations of the current density J is suitably added to the correction map 37. The operated incident dose D of each of the pixels 36 is defined in the dose map (shot data) corresponding to each pixel.

Figure 16:
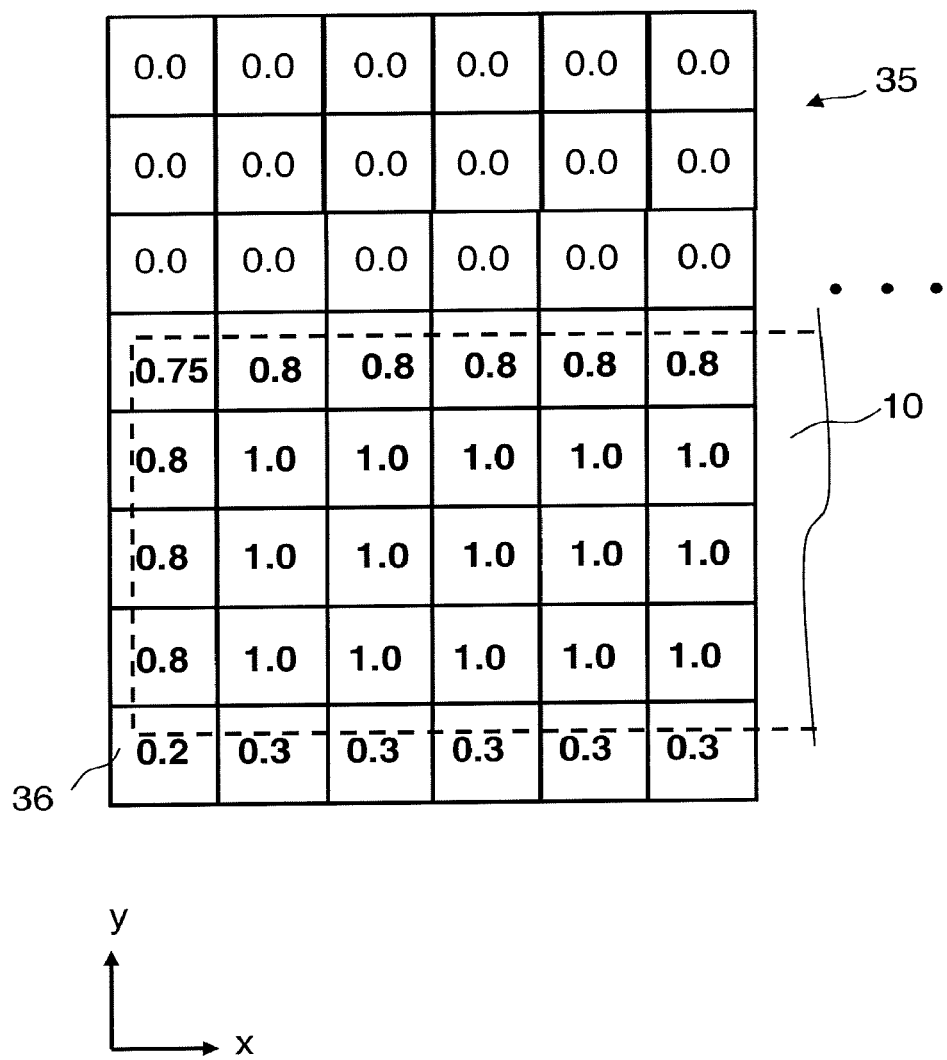
FIG. 16 is a diagram showing an example of a dose map in Embodiment 1.

FIG. 16 is a diagram showing an example of a dose map in Embodiment 1; In the dose map in FIG. 16, the incident dose D before positional displacement is corrected is defined for each of the pixels 36 in the stripe region 35. In FIG. 16, the incident dose D is shown as a ratio to preset base doses of the beam Dbase. In FIG. 16, the incident dose D of each of the pixels 36 when laid out such that a figure pattern 10 is arranged in a pattern writing region of the target object 101. In consideration of the fact that, like the example of FIG. 11, the allocation destination of the amount of modulation of beams protrudes from the setting region 33 by one pixel up and down, left and right, in FIG. 16, the lowest leftmost coordinates are defined as coordinates (0, 0). When the dose map is expanded to a region where there is no figure pattern, 0 may be defined as the incident dose D of the expanded region. In addition, the expanded region of a dose map may be appropriately set in accordance with the range of allocation destination of the amount of modulation of beams.

As the correction process (S210), when a pattern is written into the pattern writing region 31 sufficiently larger than the setting region 33 in the target object 101 by using the multiple beams 20 following a pattern writing sequence, the corrector 59 continuously uses data of the dose modulation value groups defined for a plurality of pixel regions of the same block among a plurality of blocks obtained by dividing the correction map 37 for each preset number of pixel regions without switching to data of the dose modulation value groups of another block to operate the corrected incident dose D' of a beam with which each target position (pixel 36) in the pattern writing region (here, for example, the stripe region 35). A more specific operation is as described below.

As the block selection process (S211), the selector 63 selects one block from among a plurality of blocks obtained by division. For example, the block A is selected.

As the correction element operation process (S212), the corrector 59 (dose operation unit) operates the incident dose D' of each pixel 36 in the order of sorted data. More specifically, the arithmetic processor 67 reads the partial correction map of the block A in which data is sorted from the memory 112 to successively operate the corrected dose D' being the corrected incident dose of a beam with which each of the pixel 36 is irradiated. The corrected doses D' of one pixel 36 is operated by adding the dose modulation value of the incident dose to be the amount of allocation of the incident dose to the local pixel 36, the dose modulation value of the incident dose to be the amount of allocation of the incident dose from eight surrounding pixels.

For example, as shown in FIG. 14, an operation of the fifth column of the fifth and sixth columns in the x direction of the stripe region 35 taken charge of by the block A whose processing order is No. 1 is successively performed in the y direction from below. In the partial correction map of the block A in which data is sorted, the amount of allocation is successively defined from, for example, the pixel region at the lower left of the target pixel region 38.

Figure 17A:
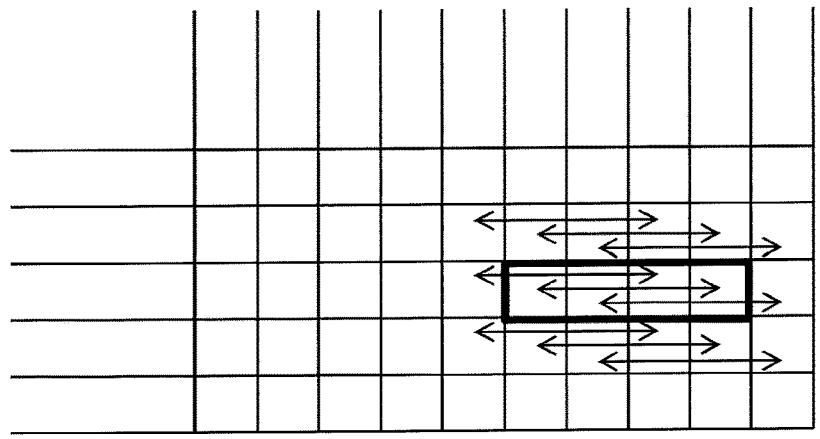
FIGS. 17A to 17C are diagrams illustrating an operation technique of the incident dose after corrections in Embodiment 1.
Figure 17B:
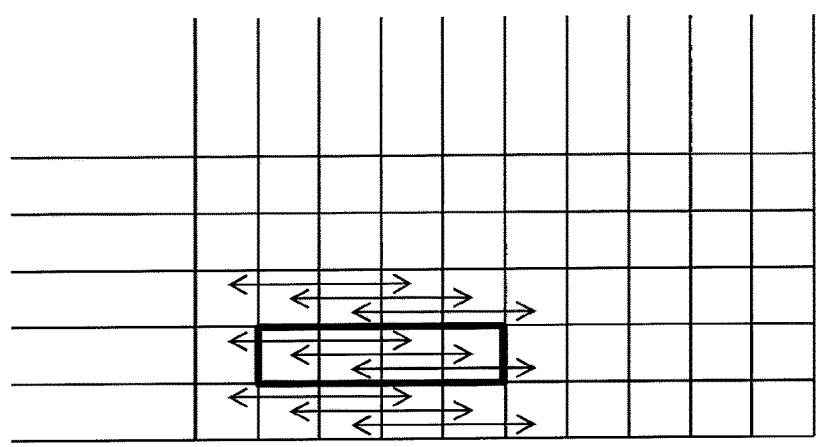
Figure 17C:
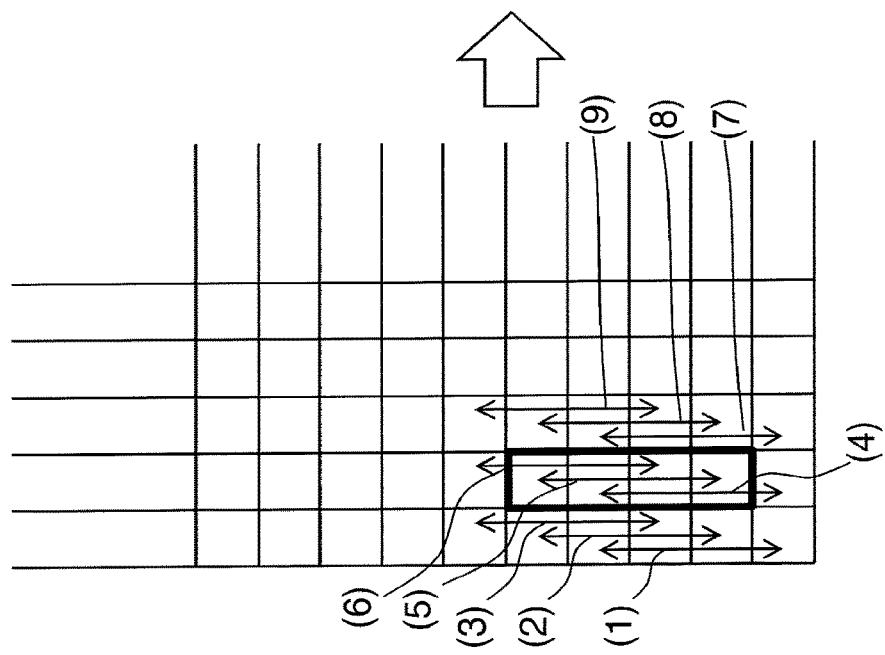

FIGS. 17A to 17C are diagrams illustrating an operation technique of the incident dose after corrections in Embodiment 1; In the example of FIG. 17A, a case in which the incident dose D' of four pixels from the pixel 36 in coordinates (5, 1) to the pixel 36 in coordinates (5, 4) of the target stripe region 35 is operated is shown. Thus, in the examples of FIGS. 17A to 17C, the lowest leftmost coordinates are (4, 0). To operate the incident dose D' of four pixels from the pixel 36 in coordinates (5, 1) to the pixel 36 in coordinates (5, 4), operation results of (1) to (9) shown below are needed.

First, the result (1) obtained by successively operating in the y direction the amount of allocation of each of four pixels from the pixel 36 in coordinates (4, 0) to the pixel 36 in coordinates (4, 3) to the pixel at the upper right is needed. In the example of FIG. 16, a value obtained by multiplying the incident dose D (D=0.3) into the pixel 36 in coordinates (4, 0) by the dose modulation value of the 51-1 data defined for the pixel region in coordinates (5, 1) is operated. Next, a value obtained by multiplying the incident dose D (D=1.0) into the pixel 36 in coordinates (4, 1) by the dose modulation value of the 52-1 data defined for the pixel region in coordinates (5, 2) is operated. Similarly, the arithmetic processor 67 successively operates the amount of allocation to the pixel at the upper right up to the pixel 36 in coordinates (4, 3). Here, data is sorted in the order of processing in the correction map and thus, operations from the pixel in coordinates (4, 0) to the pixel in coordinates (4, 3) can be performed at a time by vector processing.

Next, the result (2) obtained by successively operating in the y direction the amount of allocation of each of four pixels from the pixel 36 in coordinates (4, 1) to the pixel 36 in coordinates (4, 4) to the pixel on the right is needed. A value obtained by multiplying the incident dose D (D=1.0) into the pixel 36 in coordinates (4, 1) by the dose modulation value of the 51-2 data defined for the pixel region in coordinates (5, 1) is operated. Next, a value obtained by multiplying the incident dose D (D=1.0) into the pixel 36 in coordinates (4, 2) by the dose modulation value of the 52-2 data defined for the pixel region in coordinates (5, 2) is operated. Similarly, the arithmetic processor 67 successively operates the amount of allocation to the pixel on the right up to the pixel 36 in coordinates (4, 4). Here, data is sorted in the order of processing in the correction map and thus, operations from the pixel in coordinates (4, 1) to the pixel in coordinates (4, 4) can be performed at a time by vector processing. Then, the result (2) is added to the result (1).

Next, the result (3) obtained by successively operating in the y direction the amount of allocation of each of four pixels from the pixel 36 in coordinates (4, 2) to the pixel 36 in coordinates (4, 5) to the pixel at the lower right is needed. Then, the result (3) is added to the sum of the results (1) and (2).

Next, the result (4) obtained by successively operating in the y direction the amount of allocation of each of four pixels from the pixel 36 in coordinates (5, 0) to the pixel 36 in coordinates (5, 3) to the pixel above is needed. Then, the result (4) is added to the sum of the results (1), (2), and (3).

Next, the result (5) obtained by successively operating in the y direction the amount of allocation remaining in local four pixels from the pixel 36 in coordinates (5, 1) to the pixel 36 in coordinates (5, 4) is needed. Then, the result (5) is added to the sum of the results (1), (2), (3), and (4).

Next, the result (6) obtained by successively operating in the y direction the amount of allocation of each of four pixels from the pixel 36 in coordinates (5, 2) to the pixel 36 in coordinates (5, 5) to the pixel below is needed. Then, the result (6) is added to the sum of the results (1), (2), (3), (4), and (5).

Next, the result (7) obtained by successively operating in the y direction the amount of allocation of each of four pixels from the pixel 36 in coordinates (6, 0) to the pixel 36 in coordinates (6, 3) to the pixel at the upper left is needed. Then, the result (7) is added to the sum of the results (1), (2), (3), (4), (5), and (6).

Next, the result (8) obtained by successively operating in the y direction the amount of allocation of each of four pixels from the pixel 36 in coordinates (6, 1) to the pixel 36 in coordinates (6, 4) to the pixel on the left is needed. Then, the result (8) is added to the sum of the results (1), (2), (3), (4), (5), (6), and (7).

Next, the result (9) obtained by successively operating in the y direction the amount of allocation of each of four pixels from the pixel 36 in coordinates (6, 2) to the pixel 36 in coordinates (6, 5) to the pixel at the lower left is needed. Then, the result (9) is added to the sum of the results (1), (2), (3), (4), (5), (6), (7), and (8).

In the manner described above, the incident dose D' of four pixels from the pixel 36 in coordinates (5, 1) to the pixel 36 in coordinates (5, 4) can be operated by adding amounts of allocation stored after vector processing for each of the pixels 36.

In the example of FIG. 17B, a case in which the incident dose D' of four pixels from the pixel 36 in coordinates (5, 5) to the pixel 36 in coordinates (5, 8) of the target stripe region 35 is operated is shown. To operate the incident dose D' of four pixels from the pixel 36 in coordinates (5, 5) to the pixel 36 in coordinates (5, 8), like the example of FIG. 17A, the operation of the incident dose D and the dose modulation value for the local pixel 36 and eight pixels 36 surrounding the local pixel 36 is needed.

In the example of FIG. 17C, a case in which the incident dose D' of four pixels from the pixel 36 in coordinates (6, 1) to the pixel 36 in coordinates (6, 4) of the target stripe region 35 is operated is shown. To operate the incident dose D' of four pixels from the pixel 36 in coordinates (6, 1) to the pixel 36 in coordinates (6, 4), like the examples of FIGS. 17A and 17B, the operation of the incident dose D and the dose modulation value for the local pixel 36 and eight pixels 36 surrounding the local pixel 36 is needed.

Similarly, the incident dose D' of four pixels from the pixel 36 in coordinates (6, 5) to the pixel 36 in coordinates (6, 8) is operated.

Next, the arithmetic processor 67 similarly operates the incident dose D' of 16 pixels from the pixel 36 in coordinates (13, 1) to the pixel 36 in coordinates (14, 8) for the pixel 36 group of the thirteenth and fourteenth columns in the x direction of the stripe region 35 taken charge of by the block A whose processing order is No. 2.

Next, the arithmetic processor 67 similarly operates the incident dose D' of 16 pixels from the pixel 36 in coordinates (21, 1) to the pixel 36 in coordinates (22, 8) for the pixel 36 group of the twenty-first and twenty-second columns in the x direction of the stripe region 35 taken charge of by the block A whose processing order is No. 3.

In Embodiment 1, the partial correction map of each block is formed in a size that can be held by the cache memory 70 and thus, there is no need to read the partial correction map from the main memory 112 for each piece of processing and processing of a plurality of pixel groups of regions taken charge of by different blocks can be continued using the same block. Further, in Embodiment 1, the amount of allocation is successively operated in the same direction by shifting by one pixel due to data sorting and thus, vector processing can be performed in the same direction without needing to perform determination processing of the allocation direction for each operation.

Thus, when the amount of allocation of pixels for one column arranged in the y direction is operated, the same operation processing can mechanically be repeated without the determination processing of the allocation direction so that the operation processing can be implemented efficiently. As a result, the operation processing speed can be increased.

As the determination process (S214), the determination unit 65 determines whether the operation is completed for all blocks. If the operation is completed for all blocks, the process proceeds to the pattern writing process (S220). If the operation is not completed for all blocks, the process returns to the block selection process (S211) to repeat each process from the block selection process (S211) to the determination process (S218) for remaining blocks. More specifically, the block B is selected and the corrected doses D' are operated in the order of sorted data in descending order of No. 4 to No. 6 for the pixel 36 group of the stripe region 35 taken charge of by the block B. Subsequently, the block C is selected and the corrected doses D' are operated in the order of sorted data in descending order of No. 7 to No. 9 for the pixel 36 group of the stripe region 35 taken charge of by the block C. Subsequently, the block D is selected and the corrected doses D' are operated in the order of sorted data in descending order of No. 10 and No. 11 for the pixel 36 group of the stripe region 35 taken charge of by the block D.

In Embodiment 1, as described above, vector processing can continuously be performed in the same direction and thus, the operation can be performed efficiently.

The corrected doses D' for each of the pixels 36 are defined in a corrected dose map. The corrected doses may be defined by the beam irradiation time T instead of the dose. The corrected dose map or a beam irradiation time map is stored in, for example, the memory 112.

As the pattern writing process (S220), the pattern writer 150 writes a pattern to the target object 101 using the multiple beams 20 in such a way that each position (pixel 36) of the stripe region 35 is irradiated with a beam of the incident dose D' operated respectively. A more specific operation is as described below. First, the data processor 61 converts the incident dose D' into the beam irradiation time T and then, sorts the doses in the shot order following the pattern writing sequence. Then, sorted beam irradiation time array data is output to the deflection control circuit 130.

The deflection control circuit 130 outputs the beam irradiation time array data to each of the control circuits 41 for each shot. Then, under the control of the pattern writing controller 60, the pattern writer 150 performs pattern writing of the corresponding beam irradiation time for each shot of each beam. The operation of the pattern writer 150 is as described above.

FIGS. 18A to 18C are diagrams illustrating differences of pattern writing positions depending on whether the dose is corrected in Embodiment 1; In FIG. 18A, an example of a positionally displaced state of multiple beams (the beams b11, b21, b12, and b22) of 2×2 in the irradiation region 34 is shown. When a pattern is written into the stripe region 35 following the pattern writing sequence shown in FIGS. 6B to 7D using the beams b11, b21, b12, and b22 in such a state, positional displacements as shown in FIG. 18B arise in regions inside the stripe region 35. Thus, by making dose corrections in Embodiment 1, as shown in FIG. 18C, positional displacements can be eliminated or reduced.

Figure 19:
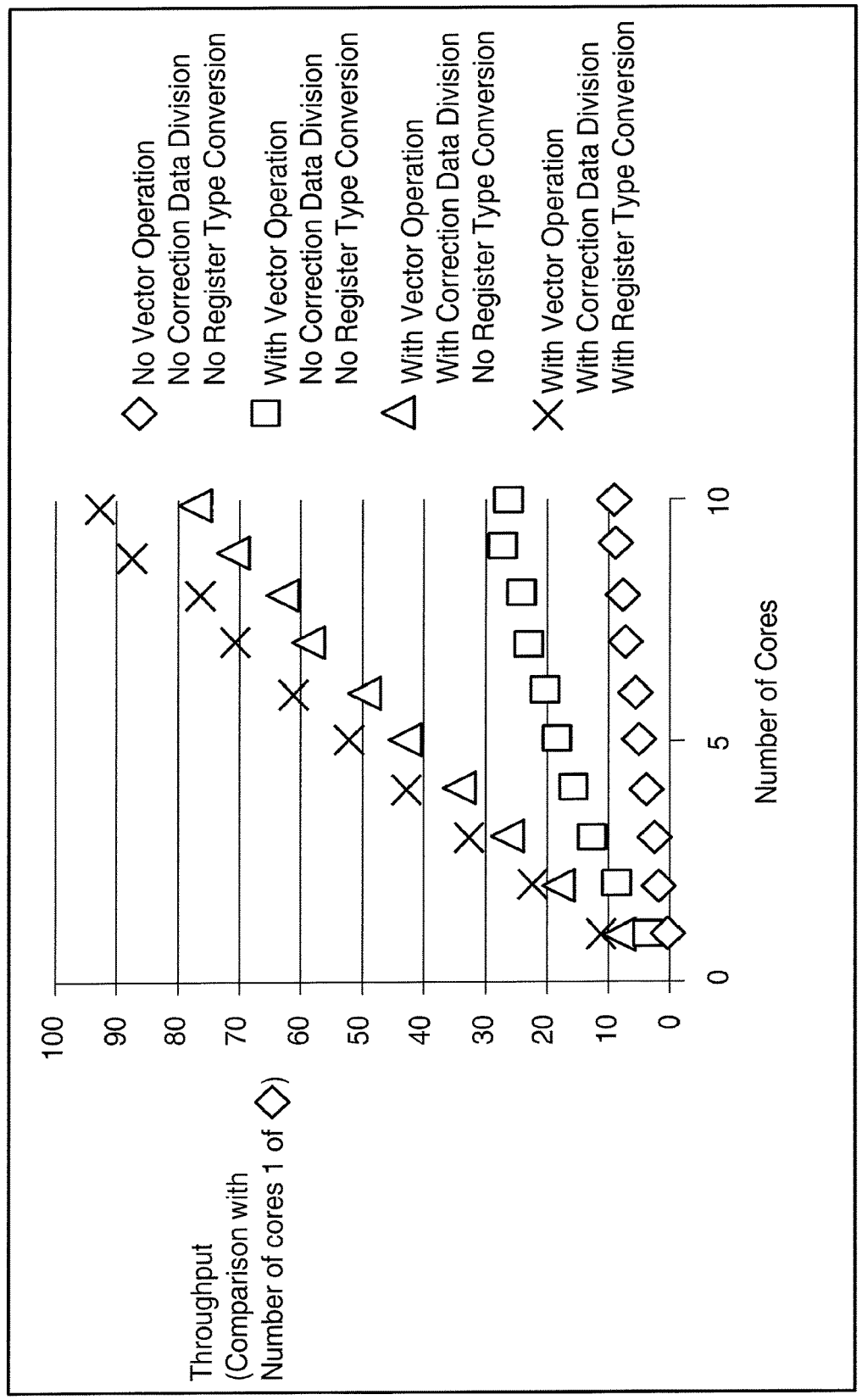
FIG. 19 is a diagram illustrating an example of differences of throughput depending on whether the correction map is divided and whether data is sorted in Embodiment 1.

FIG. 19 is a diagram illustrating an example of differences of throughput depending on whether the correction map is divided and whether data is sorted in Embodiment 1; In FIG. 19, the vertical axis represents throughput and the horizontal axis represents the number of cores to perform parallel operations by sharing a cache memory. In the example of FIG. 14, for example, the number of cores is 3 when a parallel operation in which No. 1 to No. 3 of the processing order using the block A is performed by separate cores. In FIG. 19, samples are distinguished by combining a case in which a correction map is divided into a plurality of blocks (with correction data division), a case in which a correction map is not divided into a plurality of blocks (no correction data division), a case in which correction map data is sorted and vector processing is performed (with vector operation), a case in which correction map data is not sorted and vector processing is not performed (no vector operation), a case in which type conversion of data in register is made (with register type conversion), and a case in which type conversion of data in register is not made (no register type conversion). For example, when the incident dose D before corrections and the incident dose D' after corrections are defined as 2-byte data and data in each direction of a sequence of data aij of a correction map is defined as 4-byte data, the types of data are different and thus, the type conversion from 2-byte data into 4-bype data is made in advance before the 2-bype data being stored in the register. Such a case is defined as "no register type conversion". In contrast, 2-byte data is directly input into the register and the types are fitted in the register during operation. Such a case is defined as "with register type conversion". As shown in FIG. 19, even if a correction map is not divided into a plurality of blocks, throughput can be improved somewhat by sorting data of the correction map and performing vector processing. However, throughput can be improved dramatically by dividing the correction map into a plurality of blocks. When there is no register type conversion, if the type conversion from 2-byte data into 4-byte data is made, an unnecessary free region arises, creating wasteful memory bands. Throughput can further be improved somewhat by further combining "with register type conversion" to eliminate such waste. It is clear from the result in FIG. 19 that the effect of dividing a correction map into a plurality of blocks is large. By dividing a correction map into a plurality of blocks, the amount of data of the correction map held in the cache memory 70 can be decreased so that a problem that memory bands do not catch up with the operating speed can be solved. In addition, by repeatedly using data of a correction map held in the cache memory 70, the number of times of interchanging data of the correction map can significantly be reduced.

According to Embodiment 1, as described above, data processing can be made faster while correcting positional displacement and/or dimensional displacement of a pattern formed by being irradiated with the multiple beams 20 containing a positionally-displaced beam. Therefore, throughput can be improved.

Embodiment 2

In Embodiment 1, a case in which after operating the corrected doses D' for one column using block data for pixel regions from bottom to top in the y direction of one column in the x direction of a correction map, the corrected doses D' for the next one column in the x direction are operated is described. In such operation processing, a portion of data of the dose map before corrections used for the operation of the first column is used for the operation of the next column. To eliminate waste during processing, it is desirable to keep data of the dose map before corrections once stored in the cache memory 70 and used repeatedly stored in the cache memory 70. Incidentally, some types of the cache memory 70 have a multilayer configuration. For example, the cache memory 70 is divided into a few layers from the side closer to the arithmetic processor, the cache memory 70 closest to the arithmetic processor is configured to be divided for each core, and the cache memory 70 farthest from the arithmetic processor is configured to be shared by a plurality of cores. In general, the cache memory 70 close to the arithmetic processor is faster, but has a smaller capacity. Therefore, when the number of beams of multiple beams increases and the number of pixel regions in the y direction of the setting region 33 increases, while operating the corrected doses D' for one column, data of the dose map before corrections may need to be interchanged in the cache memory 70 closest to the arithmetic processor. Thus, in Embodiment 2, a configuration that eliminates the need to interchange data of the dose map before corrections in the cache memory 70 will be described. The configuration of the lithography apparatus 100 is the same as in FIG. 1. The contents not specifically described below are the same as those in Embodiment 1.

Figure 20:
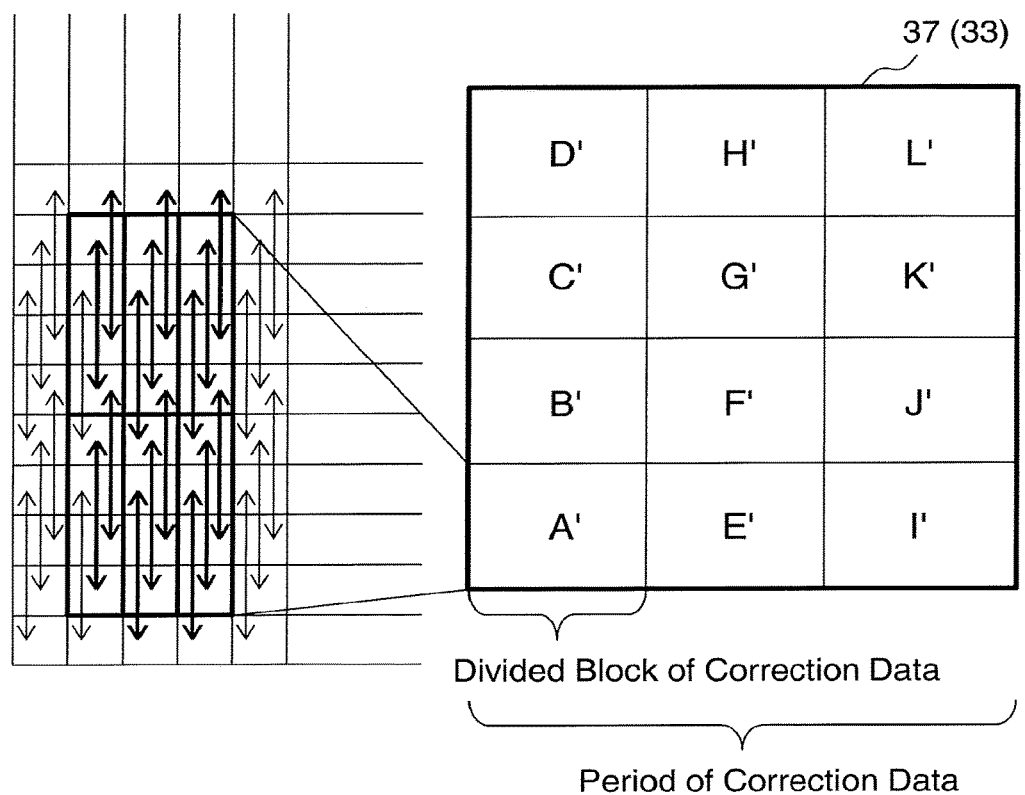
FIG. 20 is a diagram illustrating a block division and its effect in Embodiment 2.

FIG. 20 is a diagram illustrating a block division and its effect in Embodiment 2; and In Embodiment 2, as shown in FIG. 20, the setting region 33 is divided into a plurality of blocks A' to L' like a grid. Each block is constructed by increasing pixel regions contained in the x direction and instead, decreasing pixel regions from those of one column from bottom to top in the y direction. The example of FIG. 20 shows a case in which the setting region 33 is divided into 12 blocks of 3×4. In addition, the example of FIG. 20 shows a case in which the setting region (irradiation region 34) is constituted in the size of 9×32 pixel regions. Then, the example shows a case in which one block is constituted in the size of 3×8 pixel regions. Incidentally, it is needless to say that the configuration of the multiple beams 20 is not limited to 2×2 beams. If the number of pixels in the y direction per block is large, data of the dose map to be used repeatedly in the cache memory 70 may be interchanged while the corrected incident dose D' (corrected doses) is operated by vector processing. However, if the number of pixels in the y direction per block is appropriately divided, when the corrected incident dose D' (corrected doses) is operated by vector processing, processing to interchange data of the dose map during operation can be eliminated. The configuration in Embodiment 2 in which the setting region 33 is divided into a plurality of blocks in a grid shape becomes more effective with an increasing number of beams of multiple beams and with an increasing number of pixel regions in the y direction of the setting region 33.

Embodiment 3

When a plurality of chips is written by the lithography apparatus 100, for example, the incident dose D' is generally operated for each chip if pattern writing conditions such as base doses of the beam are different between chips. Thus, if pattern writing conditions are different between chips, the chip region is divided into a plurality of the stripe regions 35 for each chip and, as each embodiment described above, pattern writing processing is implemented. In other word, the corrected doses D' are operated for each chip and the pattern writer 150 performs pattern writing processing for each chip. In multiple beam pattern writing, however, as described above, pattern writing proceeds while moving the irradiation region 34 of the multiple beams 20. Thus, positional displacement arising in each of the pixel regions 38 inside the irradiation region 34 is repeated. Such circumstances are similar between chips of different pattern writing conditions. Thus, in Embodiment 3, in consideration of such circumstances, a configuration designed to improve throughput will be described further. The configuration of the lithography apparatus 100 is the same as in FIG. 1. The contents not specifically described below are the same as those in one of the above embodiments.

Figure 21:
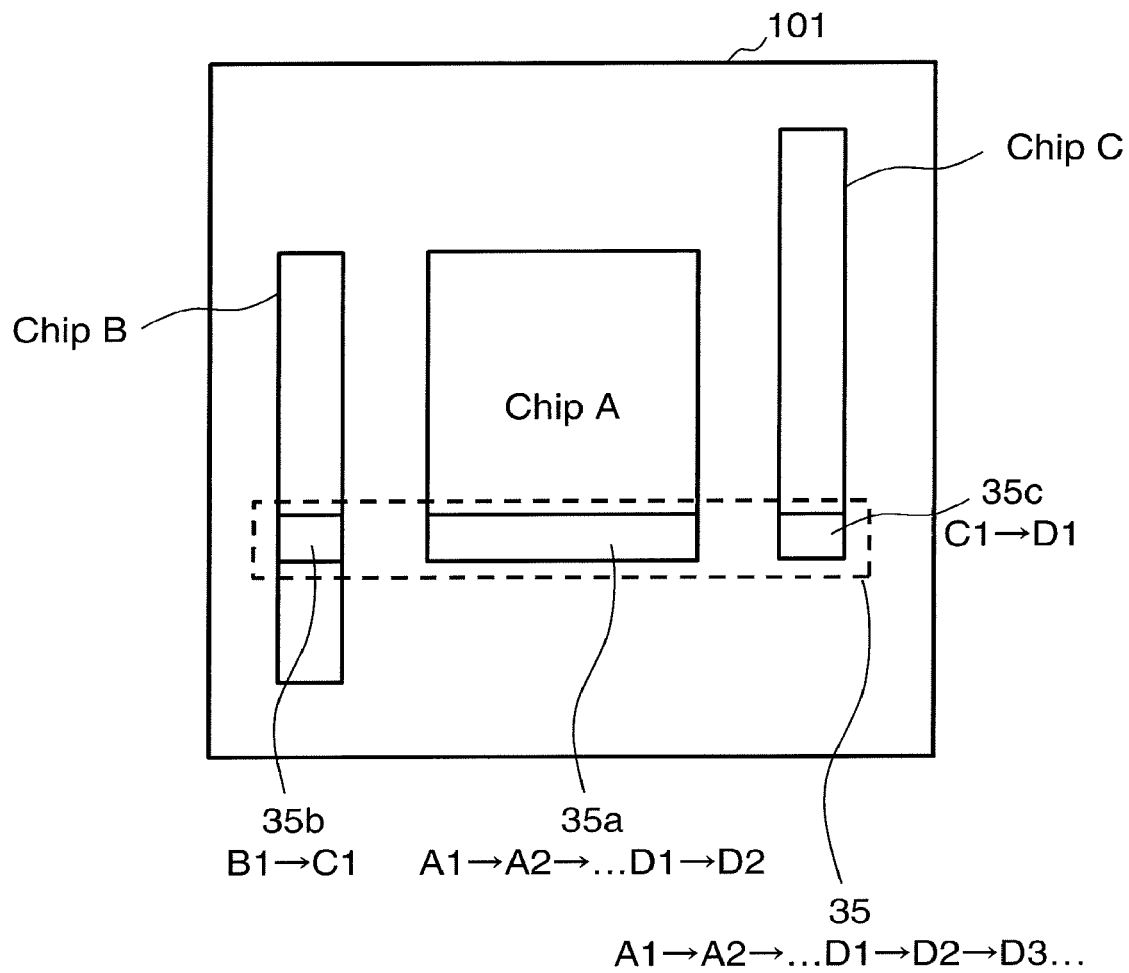
FIG. 21 is a diagram illustrating an operation technique of corrected doses in Embodiment 3.

FIG. 21 is a diagram illustrating an operation technique of corrected doses in Embodiment 3. In FIG. 21, a case in which a plurality of chips A, B, and C of different pattern writing conditions is written on the target object 101 is shown. For example, the plurality of chips A, B, and C is each individually divided into a plurality of the stripe regions 35. Then, for a stripe region 35*a* of the chip A, operation processing A1 of the amount of allocation using the partial correction map of the block A of the processing order No. 1 to, for example, operation processing D2 of the amount of allocation using the partial correction map of the block D of last place in the processing order are successively performed. For a stripe region 35b of the chip B, for example, operation processing B1 of the amount of allocation using the partial correction map of the block B of the processing order No. 1 and, for example, operation processing C1 of the amount of allocation using the partial correction map of the block C of the processing order No. 2 are performed. For a stripe region 35c of the chip C, for example, operation processing C1 of the amount of allocation using the partial correction map of the block C of the processing order No. 1 and, for example, operation processing D1 of the amount of allocation using the partial correction map of the block D of the processing order No. 2 are performed. Therefore, the cache memory 70 interchanges data of the partial correction map for each piece of operation processing of each chip.

Thus, the corrector 59 continuously uses repeatedly data of the dose modulation value groups defined for a plurality of pixels of the same block to operate the incident dose D' in the corresponding position of the target chip among plurality of chips A, B, and C and also the incident dose D' in the corresponding position of a different chip among the plurality of chips A, B, and C. A more specific operation is as described below. As shown in FIG. 21, a virtual stripe region 35 extending over the plurality of chips A, B, and C having different pattern writing conditions is set. For example, a chip region merged by performing merge processing of the plurality of chips A, B, and C may be divided into a plurality of virtual stripe regions 35. Concrete stripe regions 35a, 35b, and 35c may be individually set in the plurality of chips A, B, and C respectively. Then, a region that uses the partial correction map of the block A, a region that uses the partial correction map of the block B, . . . are extracted for each of the virtual stripe regions 35. Then, for each of the virtual stripe regions 35, operation processing A1 of the amount of allocation using the partial correction map of the block A of the processing order No. 1 to, for example, operation processing D3 of the amount of allocation using the partial correction map of the block D of last place in the processing order are successively performed by extending over the plurality of chips A, B, and C having different conditions.

With the above configuration, there is no need for the cache memory 70 to interchange data of the partial correction map for each piece of operation processing of each chip so that processing can continuously be performed together. Thus, throughput can be improved. For a chip whose size in the x direction is small like the chips B and C shown in FIG. 21, the same block cannot be continuously used and thus, enabling to use the same block continuously is particularly effective in improving throughput. Because pattern writing conditions are different, the pattern writer 150 may perform pattern writing processing for each of the plurality of chips.

In the foregoing, the embodiments have been described with reference to concrete examples. However, the present disclosure is not limited to these concrete examples.

In the above examples, a case in which a 10-bit control signal is input for control of each of the control circuits 41 is shown, but the number of bits may appropriately be set. For example, a 2-bit or a 3-bit to 9-bit control signal may be used. Incidentally, an 11-bit control signal or higher may also be used.

Parts of the apparatus configuration, the control method, and the like which are not needed to be explained directly for the explanation of the present disclosure are not described. However, a necessary apparatus configuration and a necessary control method can be appropriately selected and used. For example, a controller configuration which controls the lithography apparatus 100 is not described. However, a necessary controller configuration is appropriately selected and used, as a matter of course.

In addition, all multiple charged particle beam lithography apparatuses and multiple charged particle beam pattern writing methods including elements of the present disclosure and the design of which can appropriately be changed by a person skilled in the art are included in the scope of the present disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam lithography apparatus comprising:
    dose modulation data calculation processing circuitry configured to calculate, for each of a plurality of pixel regions to be regions obtained by dividing a setting region of a size that does not exceed double size of multiple charged particle beams as a whole by a predetermined quantization dimension into a grid shape, a first dose modulation value of a beam into a target pixel region that corrects, by modulating a dose, a positional displacement of an irradiation pattern caused by a positional displacement of a beam with which the target pixel region is irradiated following a pattern writing sequence and a second dose modulation value to allocate a dose to at least one pixel region around the target pixel region;
    dose modulation map creation processing circuitry configured to create a dose modulation map in which a dose modulation value groups is defined for each of the pixel regions in the setting region such that, for each of the pixel regions, the first dose modulation value calculated of the beam to the target pixel region is defined in a position of the target pixel region and the second dose modulation value to allocate a dose to the at least one pixel region around the target pixel region is defined in a position of the at least one pixel region around the target pixel region by associating with the position of the target pixel region;
    dose operation processing circuitry configured to, in a case that a pattern is written into a pattern writing region sufficiently larger than the setting region in a target object by using the multiple charged particle beams following the pattern writing sequence, operate an incident dose of a beam to each position intended inside the pattern writing region by continuously using repeatedly data of dose modulation value groups defined for a plurality of pixel regions of a same block among a plurality of blocks obtained by dividing the dose modulation map for each preset number of pixel regions without switching to data of dose modulation value groups of other blocks; and
    a pattern writer configured to write a pattern to the target object using the multiple charged particle beams such that the each position is irradiated with a beam of the incident dose operated for each.

2. The apparatus according to claim 1, further comprising: block division processing circuitry configured to divide the dose modulation map into the plurality of blocks for the each preset number of pixel regions.

3. The apparatus according to claim 1, further comprising:
a cache memory,
wherein the dose modulation map is divided into the plurality of blocks in a number of the pixel regions of a data size that can be held in the cache memory.

4. The apparatus according to claim 1, further comprising:
arrangement order change processing circuitry configured to sort data of the dose modulation value groups defined for the plurality of pixel regions of each of the plurality of blocks in each allocation direction,
wherein the dose operation processing circuitry operates an amount of allocation of the incident dose of each allocation destination in an order of sorted data.

5. The apparatus according to claim 1,
wherein the pattern writer performs pattern writing processing for each of a plurality of chips, and
the dose operation processing circuitry operates the incident dose in a corresponding position of a target chip among the plurality of chips and the incident dose in a corresponding position of different chips by continuously using repeatedly data of the dose modulation value groups defined for the plurality of pixel regions of the same block.

6. The apparatus according to claim 4, wherein the dose operation processing circuitry operates the incident dose in a same direction by sorting data to shift the amount of allocation thereof by one pixel.

7. The apparatus according to claim 1, further comprising:
a selection processing circuitry configured to select one block from among the plurality of blocks.

8. The apparatus according to claim 7, further comprising:
arrangement order change processing circuitry configured to sort data of the dose modulation value groups defined for the plurality of pixel regions of each of the plurality of blocks in each allocation direction,
wherein the dose operation processing circuitry operates an amount of allocation of the incident dose of each allocation destination in an order of data sorted by a selected block.

9. The apparatus according to claim 8, wherein the dose operation processing circuitry operates the incident dose in a same direction by sorting data by the selected block to shift the amount of allocation thereof by one pixel.

10. A multiple charged particle beam pattern writing method comprising:
calculating, for each of a plurality of pixel regions to be regions obtained by dividing a setting region of a size that does not exceed double that of multiple charged particle beams as a whole by a predetermined quantization dimension into a grid shape, a first dose modulation value of a beam into the target pixel region that corrects a positional displacement of an irradiation pattern caused by a positional displacement of a beam with which the target pixel region is irradiated following a pattern writing sequence and a second dose modulation value to allocate a dose to at least one pixel region around the target pixel region;
creating a dose modulation map in which a dose modulation value group is defined for each of the pixel regions in the setting region such that, for each of the pixel regions, the first dose modulation value calculated of the beam to the target pixel region is defined in a position of the target pixel region and the second dose modulation value to allocate a dose to at least the one pixel region around the target pixel region is defined in a position of at least the one pixel region around the target pixel region by associating with the position of the target pixel region;
operating, when a pattern is written into a pattern writing region sufficiently larger than the setting region in a target object by using the multiple charged particle beams following the pattern writing sequence, an incident dose of a beam to each position intended inside the pattern writing region by continuously using repeatedly data of dose modulation value groups defined for a plurality of pixel regions of a same block among a plurality of blocks obtained by dividing the dose modulation map for each preset number of pixel regions without switching to data of dose modulation value groups of other blocks; and
writing a pattern to the target object using the multiple charged particle beams such that the each position is irradiated with a beam of the incident dose operated for each.

* * * * *